United States Patent
Tseng et al.

(10) Patent No.: US 12,125,851 B2
(45) Date of Patent: Oct. 22, 2024

(54) FINFET DEVICE AND METHOD OF FORMING THE SAME

(71) Applicant: Taiwan Semiconductor Manufacturing Company, Ltd., Hsinchu (TW)

(72) Inventors: Szu-Wei Tseng, Hsinchu (TW); Jiun-Ming Kuo, Taipei (TW); Yuan-Ching Peng, Hsinchu (TW); Kuo-Yi Chao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 186 days.

(21) Appl. No.: 17/243,513

(22) Filed: Apr. 28, 2021

(65) Prior Publication Data
US 2022/0352153 A1    Nov. 3, 2022

(51) Int. Cl.
*H01L 27/088* (2006.01)
*H01L 21/311* (2006.01)
*H01L 21/8234* (2006.01)
*H01L 29/423* (2006.01)
*H01L 29/66* (2006.01)
*H01L 29/78* (2006.01)

(52) U.S. Cl.
CPC .... *H01L 27/0886* (2013.01); *H01L 21/31116* (2013.01); *H01L 21/823431* (2013.01); *H01L 21/823456* (2013.01); *H01L 21/823481* (2013.01); *H01L 29/42376* (2013.01); *H01L 29/66545* (2013.01); *H01L 29/66795* (2013.01); *H01L 29/7851* (2013.01)

(58) Field of Classification Search
CPC . H01L 29/165; H01L 29/267; H01L 27/0886; H01L 21/311; H01L 21/3116; H01L 21/31105; H01L 21/31111; H01L 21/31116
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,214,358 B1 * | 12/2015 | Lin | H01L 21/845 |
| 9,236,267 B2 | 1/2016 | De et al. | |

(Continued)

FOREIGN PATENT DOCUMENTS

CN    104078357 A   *   10/2014  ....... H01L 29/42356

*Primary Examiner* — Tuan A Hoang
(74) *Attorney, Agent, or Firm* — JCIPRNET

(57) ABSTRACT

The embodiments of the disclosure provide a FinFET. The FinFET includes a substrate, a first gate stack and a second gate stack. The substrate has a first fin and a second fin. The first gate stack is across the first fin and extends along a widthwise direction of the first fin. The second gate stack is across the second fin and extends along a widthwise direction of the second fin. A bottommost surface of the first gate stack is lower than a bottommost surface of the second gate stack, and a first gate height of the first gate stack directly on the first fin is substantially equal to a second gate height of the second gate stack directly on the second fin.

20 Claims, 20 Drawing Sheets

(56) References Cited

U.S. PATENT DOCUMENTS

| | | |
|---|---|---|
| 9,236,300 B2 | 1/2016 | Liaw |
| 9,520,482 B1 | 12/2016 | Chang et al. |
| 9,576,814 B2 | 2/2017 | Wu et al. |
| 10,157,770 B2 * | 12/2018 | Wu .................. H01L 21/76232 |
| 2015/0056795 A1 * | 2/2015 | Kang ................ H01L 29/66795 |
| | | 438/585 |
| 2019/0189614 A1 * | 6/2019 | Lee .................. H01L 29/66636 |

* cited by examiner

FINFET DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs. Such scaling down has also increased the complexity of manufacturing ICs and, for these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
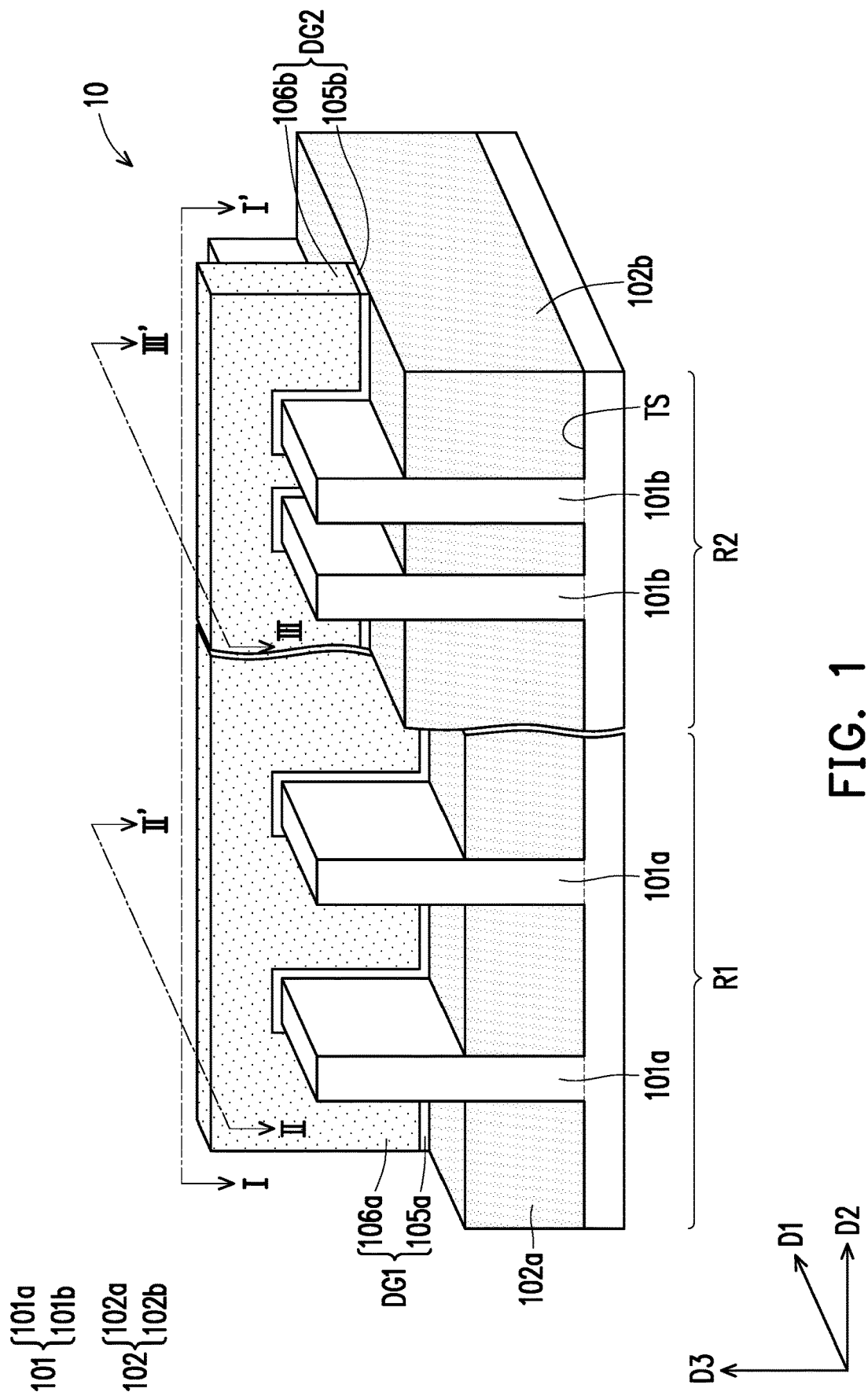
FIG. 1 is a three-dimensional view illustrating a semiconductor structure in intermediate stage for forming a fin-type field effect transistor (FinFET) device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments in which the semiconductor device is fin-type field effect transistor (FinFET) device, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial material layer is formed over a substrate and patterned using a photolithography process. Spacers are formed alongside the patterned sacrificial material layer using a self-aligned process. The sacrificial material layer is then removed, and the remaining spacers may then be used to pattern the fins.

A semiconductor device (e.g. FinFET device) and method of forming the same are provided in accordance with some embodiments of the disclosure. Various embodiments are directed to provide a FinFET device including a plurality of gate structures, which are formed to have substantially the same gate heights, so as to improve device performance. Throughout the various views and illustrative embodiments, like reference numbers are used to designate like elements.

FIG. 1 is a three-dimensional view illustrating a semiconductor structure 10 in intermediate stage for forming a FinFET device, in accordance with some embodiments of the disclosure.

Referring to FIG. 1, the semiconductor structure 10 includes a substrate 100 having a plurality of fins 101. The fins 101 protrude from a top surface TS of the substrate 100 in a direction D3 and extend along a direction D1. In some embodiments, the fins 101 are arranged along a direction D2 perpendicular to the direction D1 and spaced from each other. In other words, the lengthwise direction of the fin 101 is along the direction D1, and the widthwise direction of the fin 101 is along the direction D2. An isolation structure 102 is formed on the substrate 100 and laterally covering lower portions of the fins 101. One or more gate structures, such as dummy gate structure DG1 and DG2 are formed over the substrate 100 and across the plurality of fins 101 and the isolation structure 102. In some embodiments, the dummy gate structures DG1 and DG2 extend along the widthwise direction (i.e. direction D2) of the fins 101. It is noted that, the number of fins 101 and dummy gate structures shown in the figures are merely for illustration, and the disclosure is not limited thereto.

Figure 6:
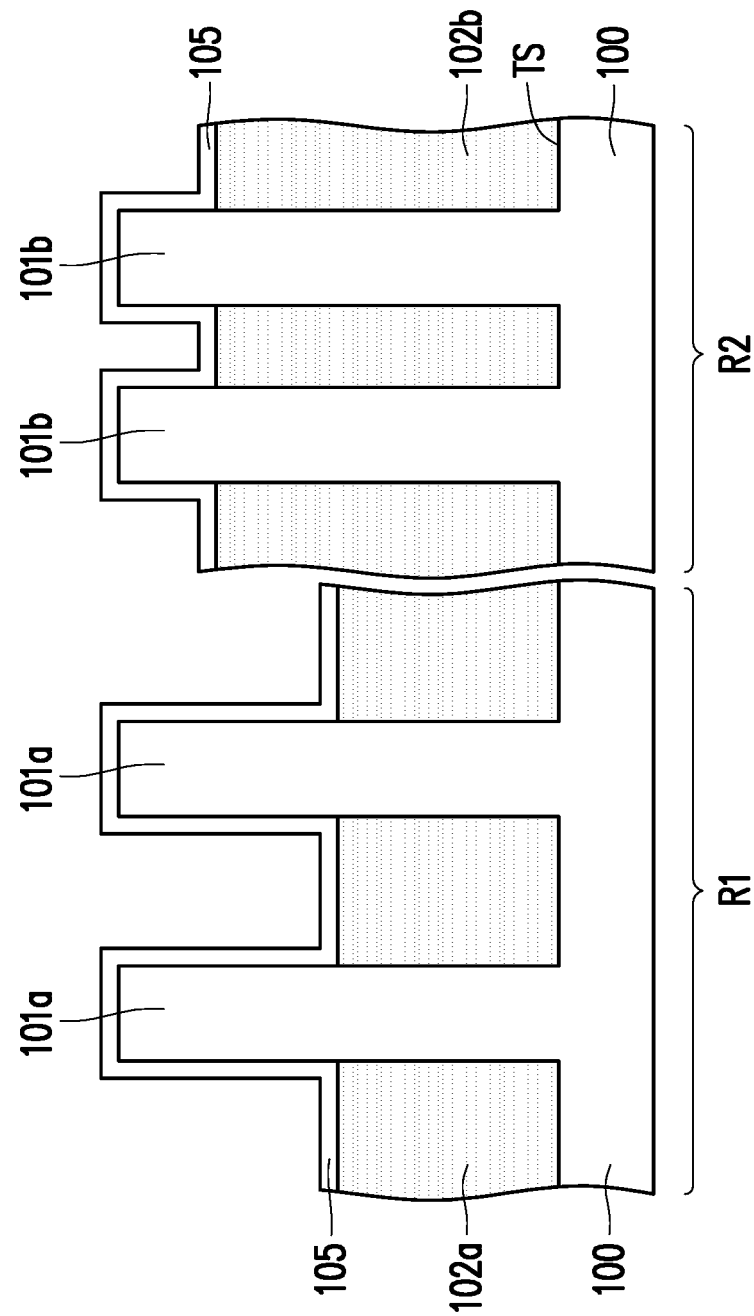
Figure 7A:
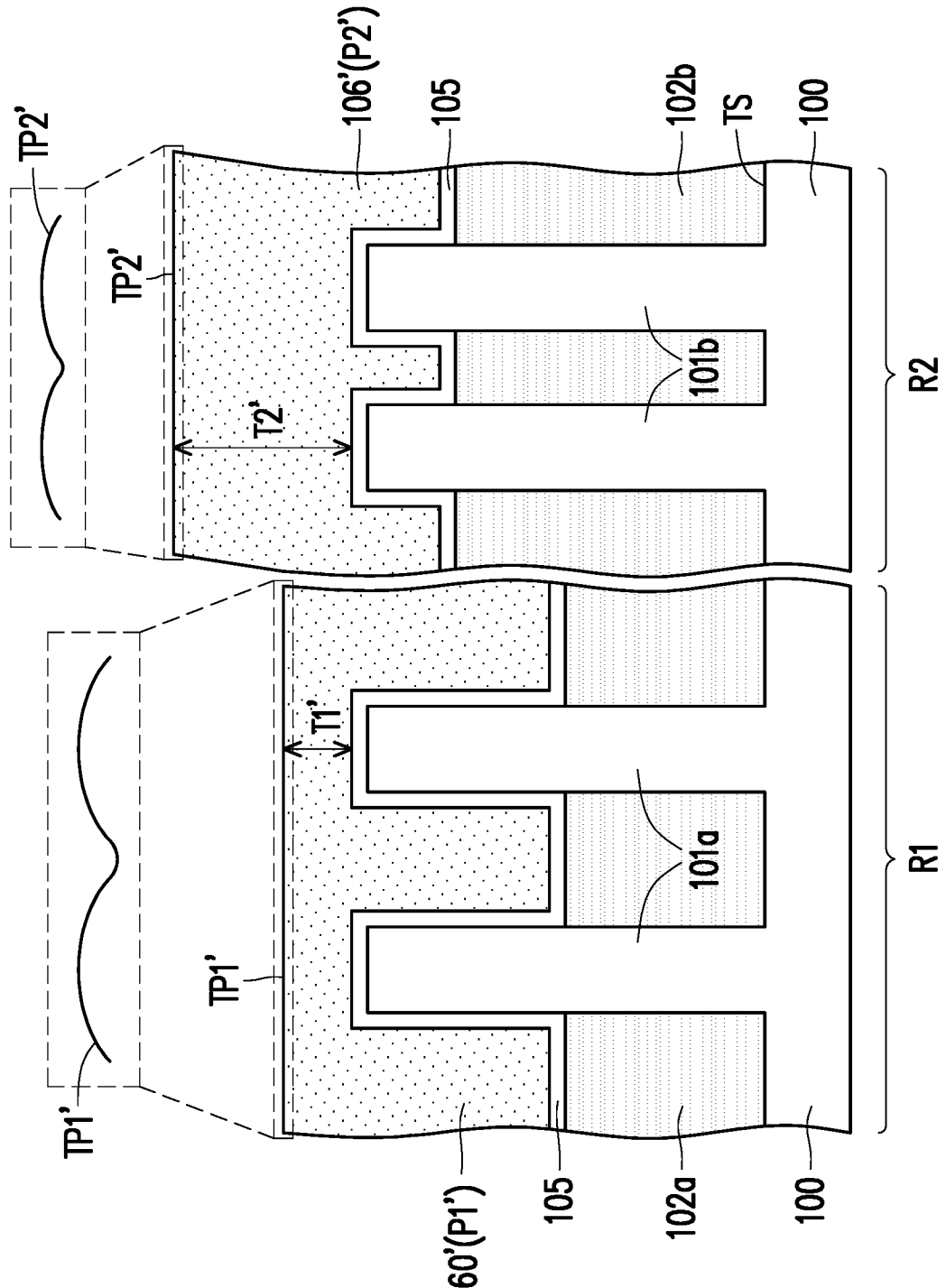
Figure 7B:
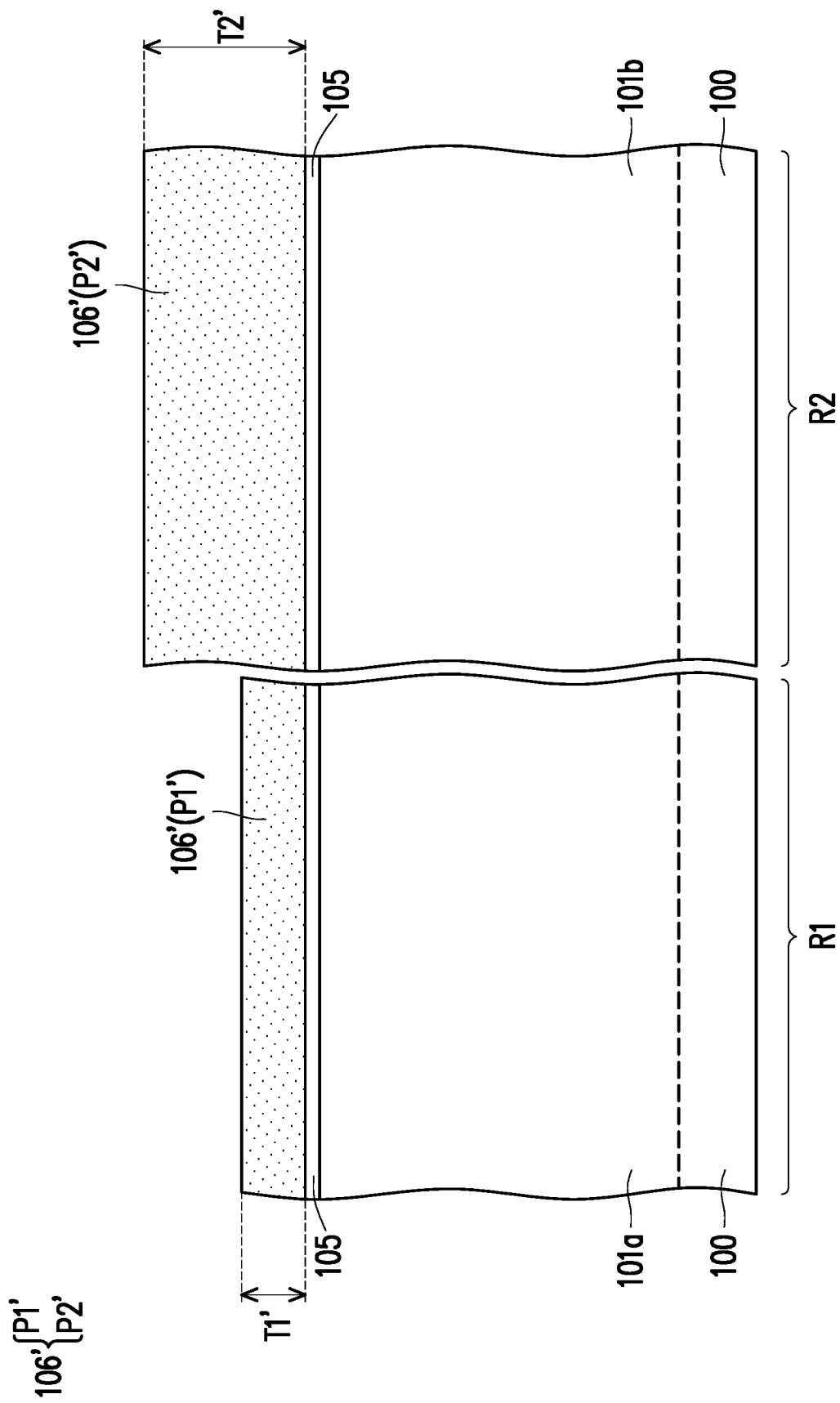
Figure 8A:
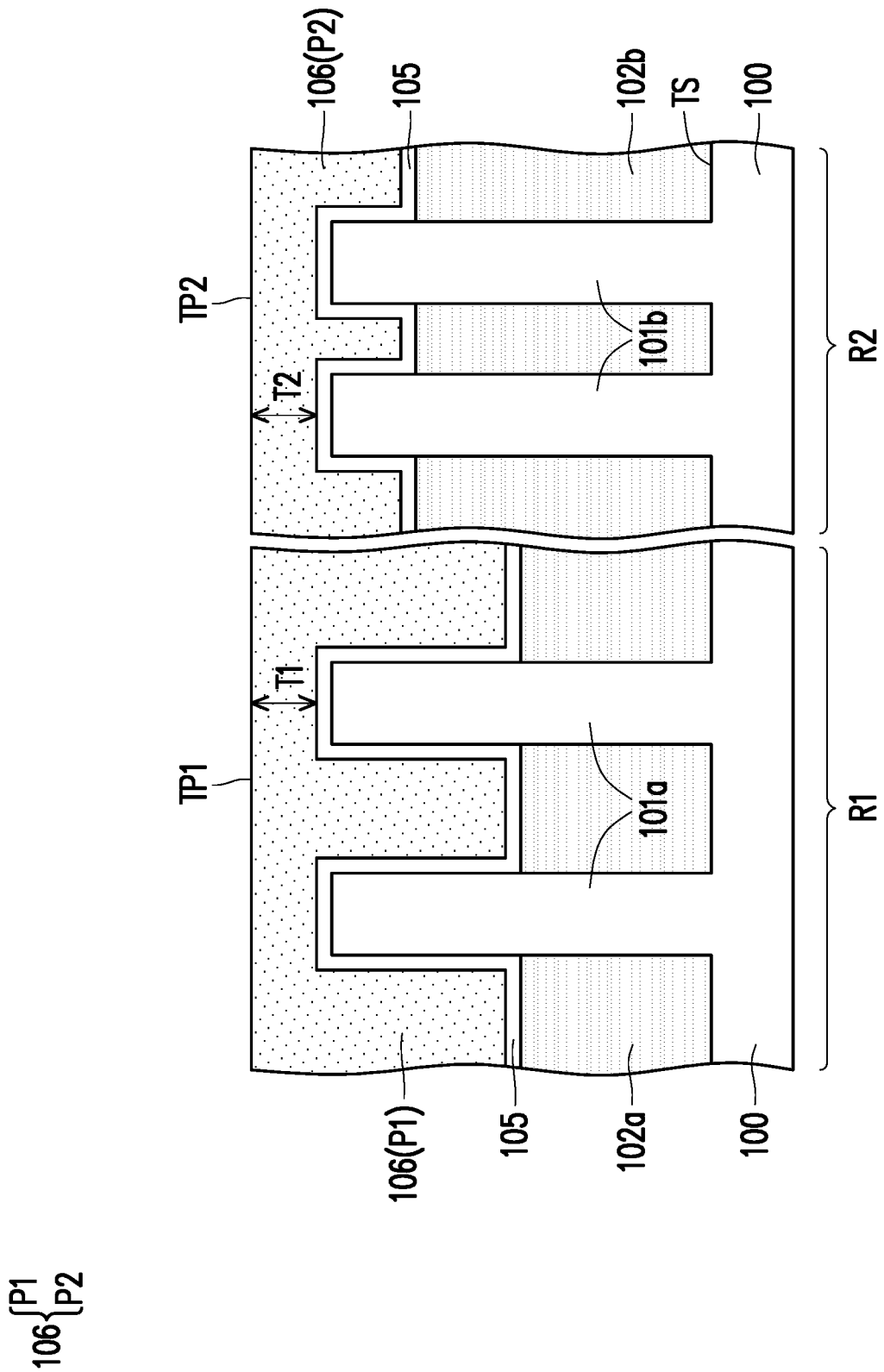
Figure 8B:
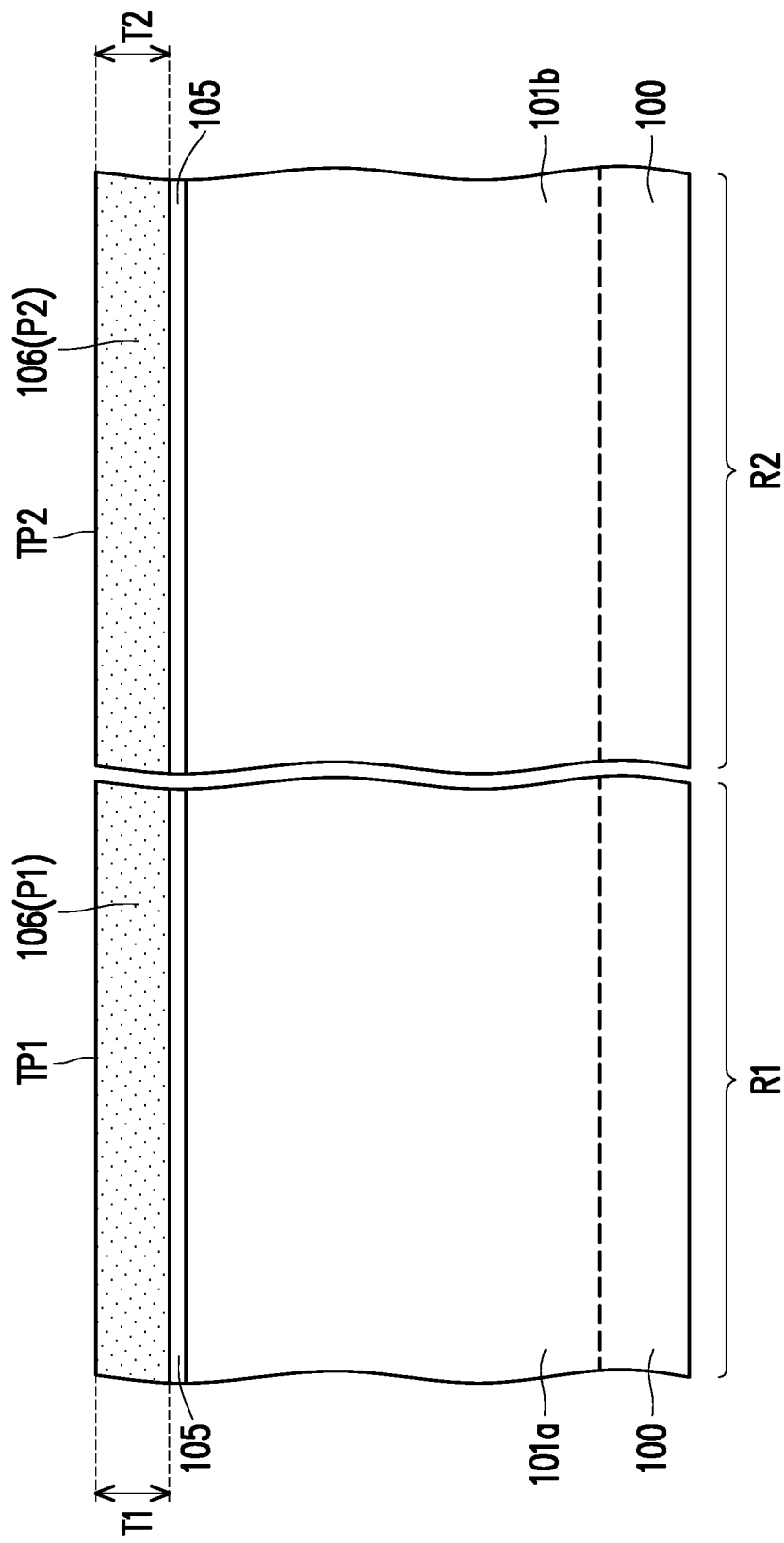
Figure 9A:
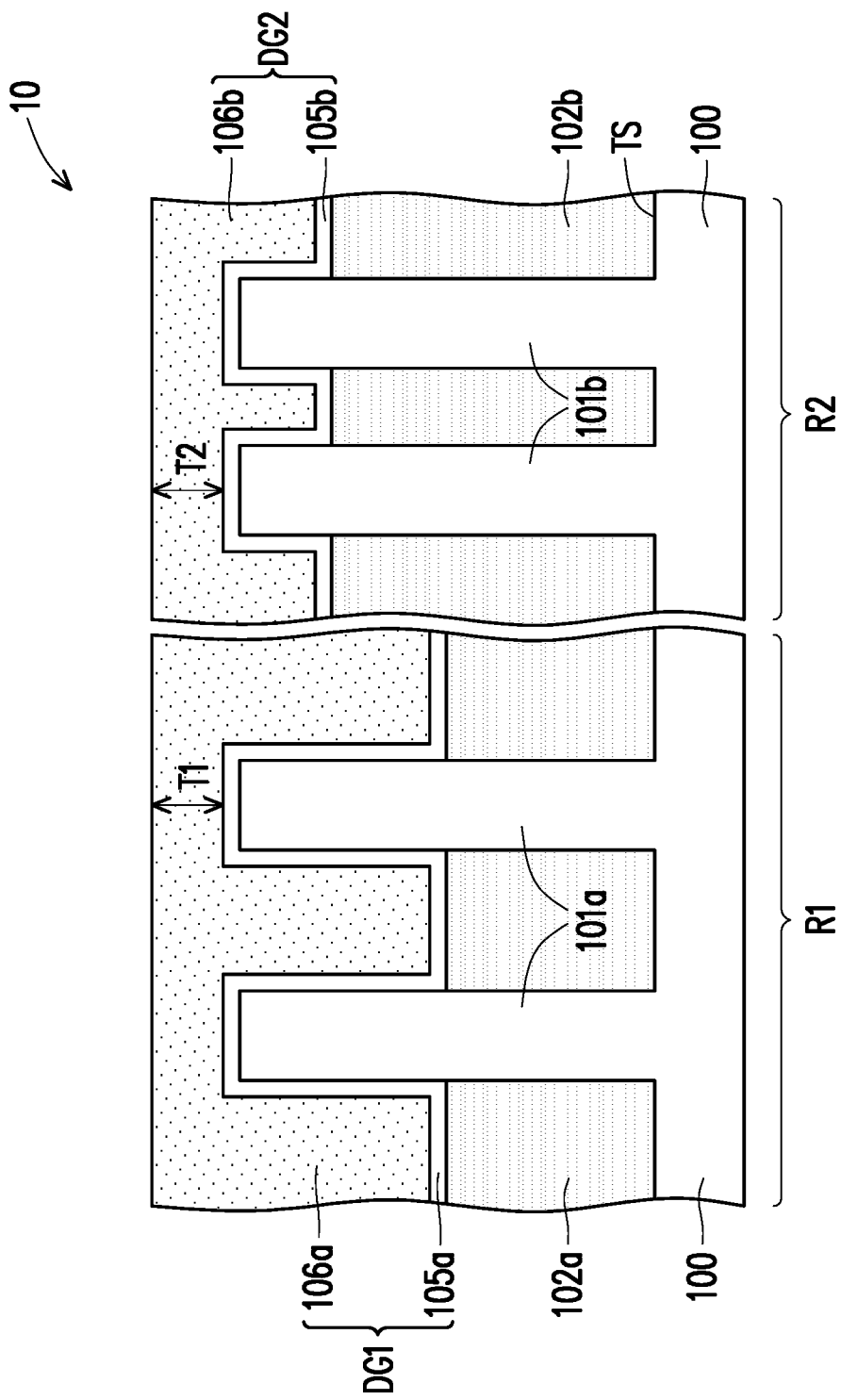
Figure 12A:
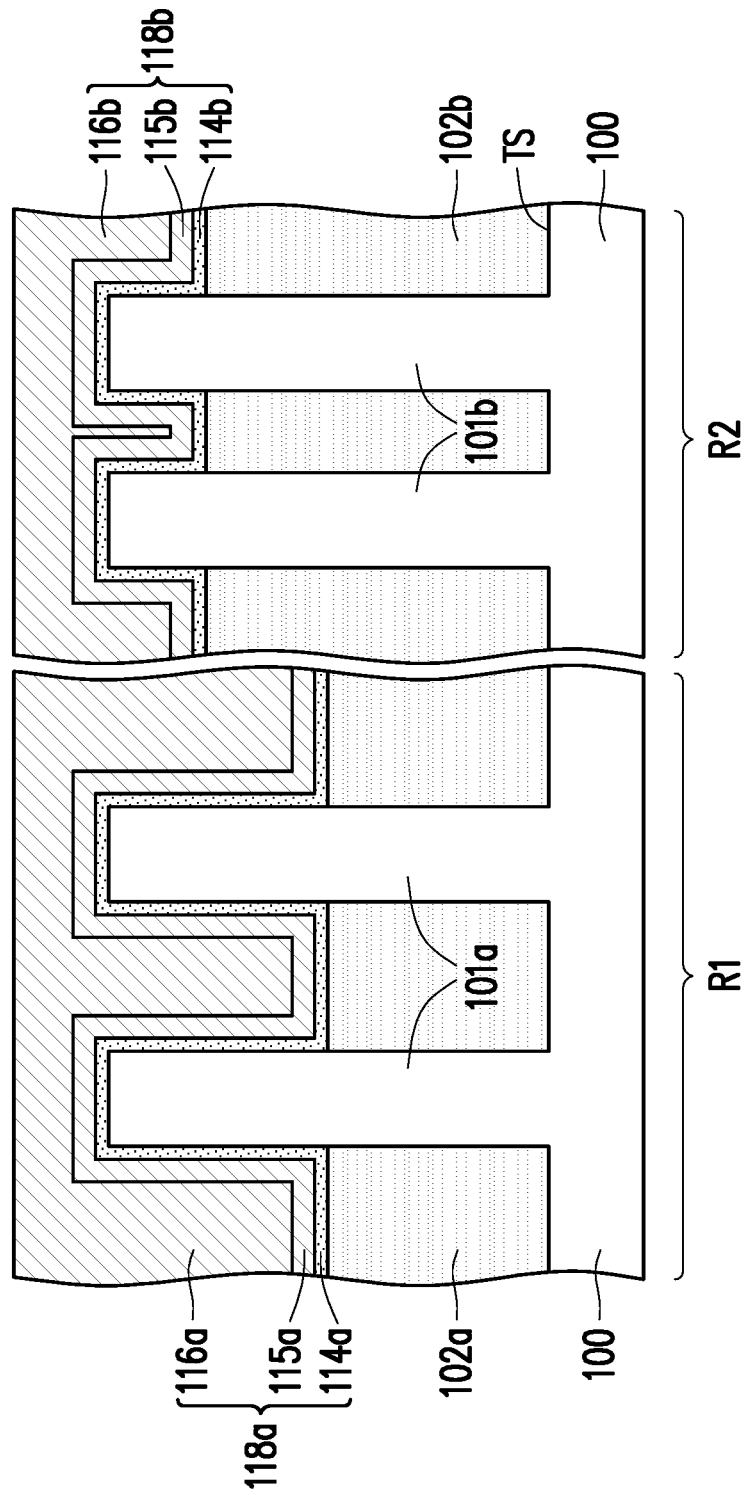
Figure 12B:
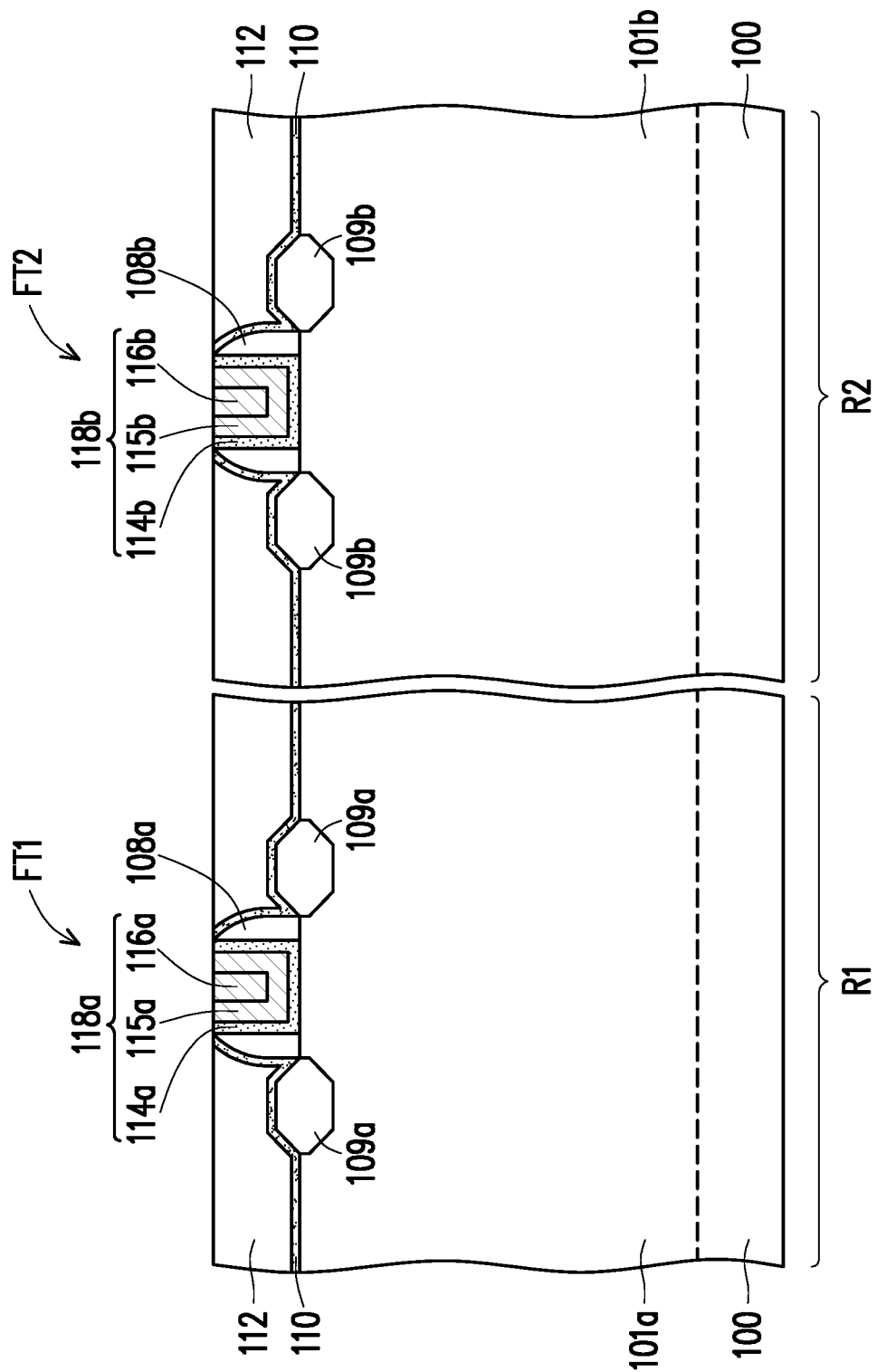
Figure 13A:
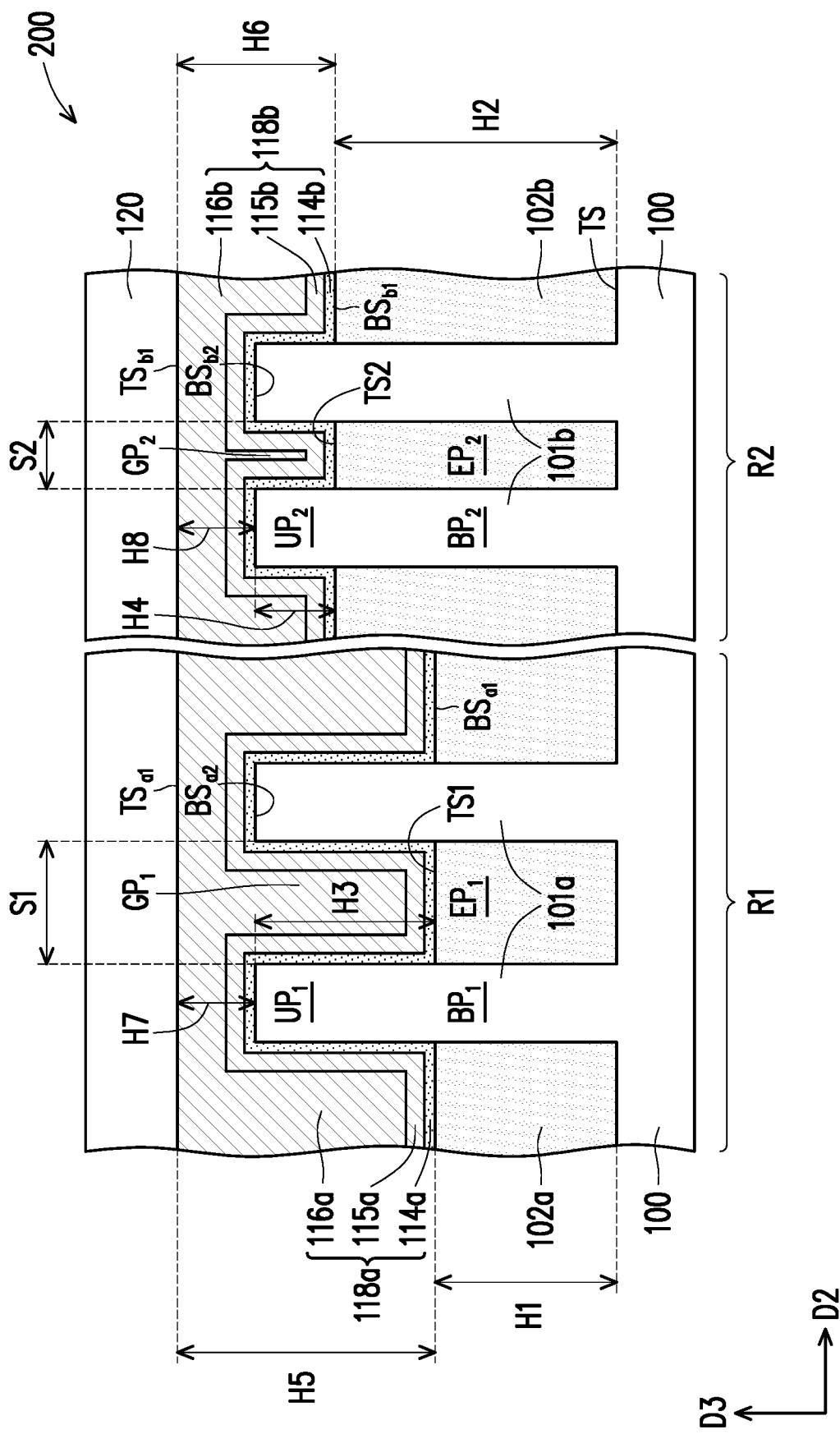

FIG. 2 to FIG. 13 are cross-sectional views illustrating various stages of manufacturing method of a FinFET device according to some embodiments of the disclosure, wherein FIG. 2 to FIG. 6, and FIG. 7A/7B to FIG. 8A/8B illustrates the intermediate stages for forming the semiconductor structure 10 shown in FIG. 1, and FIG. 9A/9B to FIG. 13A/13B illustrate the subsequent processes performed on the semiconductor structure 10 for forming the FinFET device. FIG. 2 to FIG. 6 and FIG. 7A to FIG. 13A are cross-sectional views of intermediate stages in the manufacturing of the FinFET, and are shown along I-I' line of FIG. 1. FIG. 9B to FIG. 13B are cross-sectional views of intermediate stages in the manufacturing of the FinFET, and are shown along II-II' line (in region R1) and line (in region R2) of FIG. 1.

Figure 2:
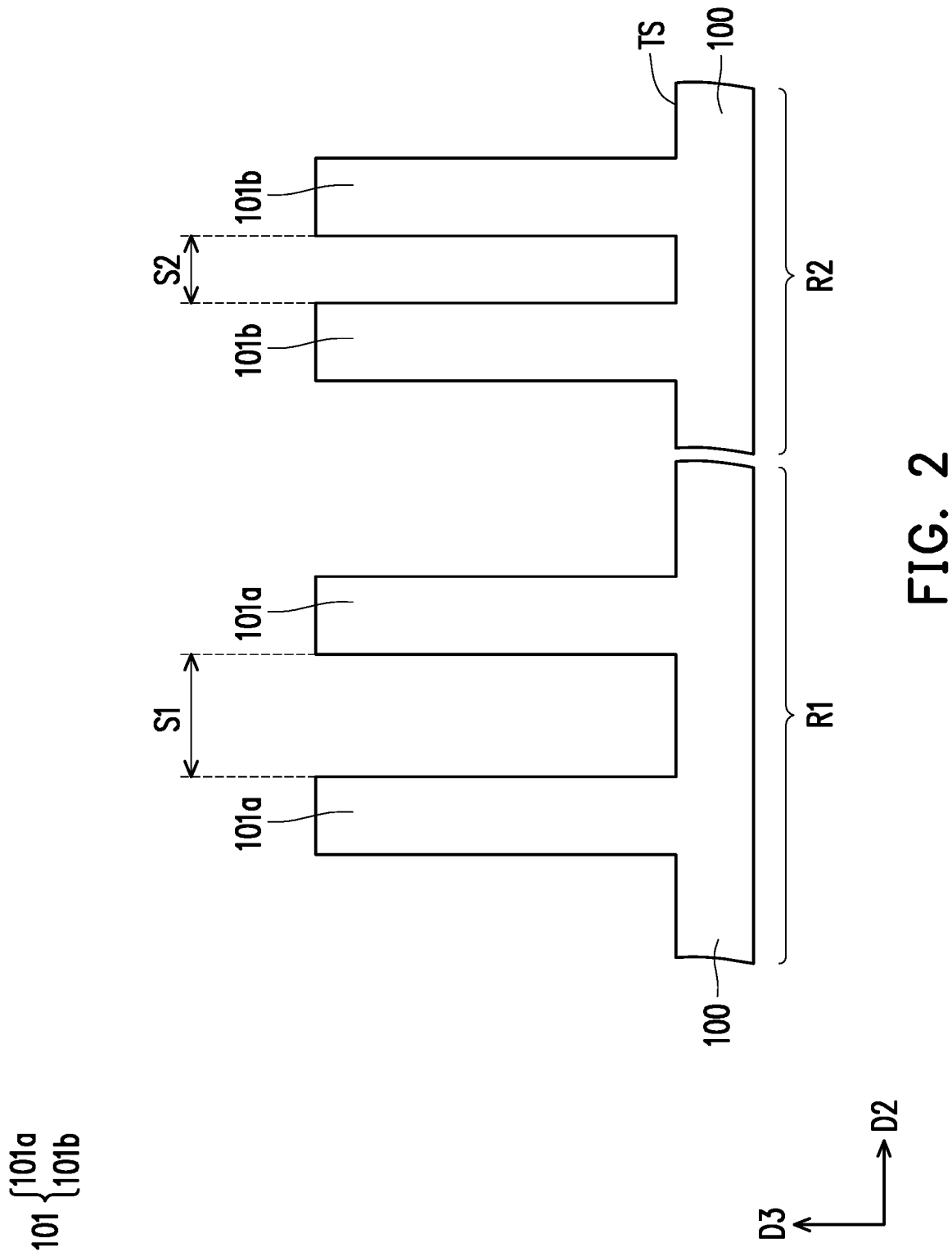
FIG. 2 to FIG. 6, and FIG. 7A/7B to FIG. 13A/13B are cross-sectional views illustrating a method of forming a FinFET device, according to some embodiments of the disclosure.

Referring to FIG. 1 and FIG. 2, a substrate 100 is provided. The substrate 100 is a semiconductor substrate, which may be doped (e.g., with a p-type or an n-type dopant) or undoped. The substrate 100 may be a semiconductor wafer, such as a silicon wafer. Other substrates, such as a multi-layered or gradient substrate may also be used. In some embodiments, the material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

In some embodiments, the substrate 100 is patterned to form a plurality of fins 101. The fins 101 are semiconductor strips arranged along the direction D2 and spaced from each other. The widths of fins 101 may be the same or different, and the spacings between different fins 101 may be the same or different. In some embodiments, the substrate 100 is patterned to include multiple groups of fins having different patterns (e.g. different size, spacing, etc.) disposed in different regions of the substrate 100. For example, the substrate 100 includes a first group of fins 101a in a first region R1 and a second group of fins 101b in a second region R2. The first region R1 and the second region R2 may be immediately adjacent to each other, or spaced from each other by other regions. The fins 101a and the fins 101b have different patterns. In some embodiments, the spacing S1 between two adjacent fins 101a is different form (e.g., larger than) the spacing S2 between two adjacent fins 101b. For example, the ratio of the spacing S2 to the spacing S1 may range from 0.009 to 0.5. Although two groups of fins having different patterns, and two fins are shown to be included in each group of fins for illustration, the disclosure is not limited thereto. The substrate 100 may be patterned to have any suitable number of fin groups. In some embodiments, more than two groups of fins having different patterns may be formed, and each group of fins may include any suitable number of fins. In some embodiments, the top surfaces of the fins 101a and 101b are substantially coplanar with each other.

Figure 3:
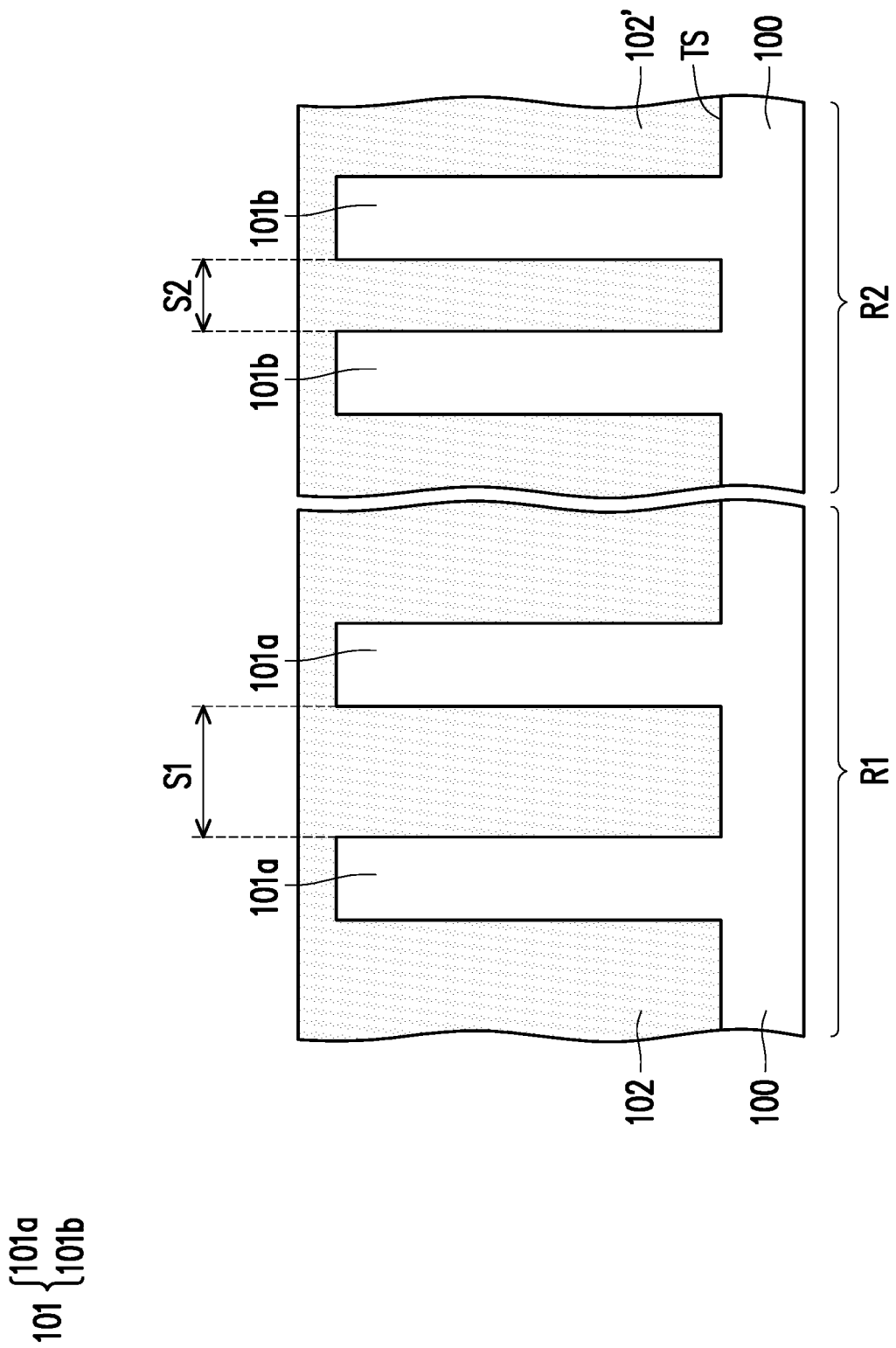

Referring to FIG. 3, an insulating material 102' is formed on the substrate 100 and between the neighboring fins 101. In some embodiments, the insulating material 102' is formed to cover top surfaces and sidewalls of the fins 101. The insulation material 102' may include an oxide such as silicon oxide, a nitride such as silicon nitride, the like, or a combination thereof, and may be formed by a high density plasma chemical vapor deposition (HDP-CVD), a flowable CVD (FCVD), the like, or a combination thereof. Other insulation materials formed by any acceptable process may also be used. In some embodiments, an anneal process may be performed once the insulation material is formed.

Figure 4:
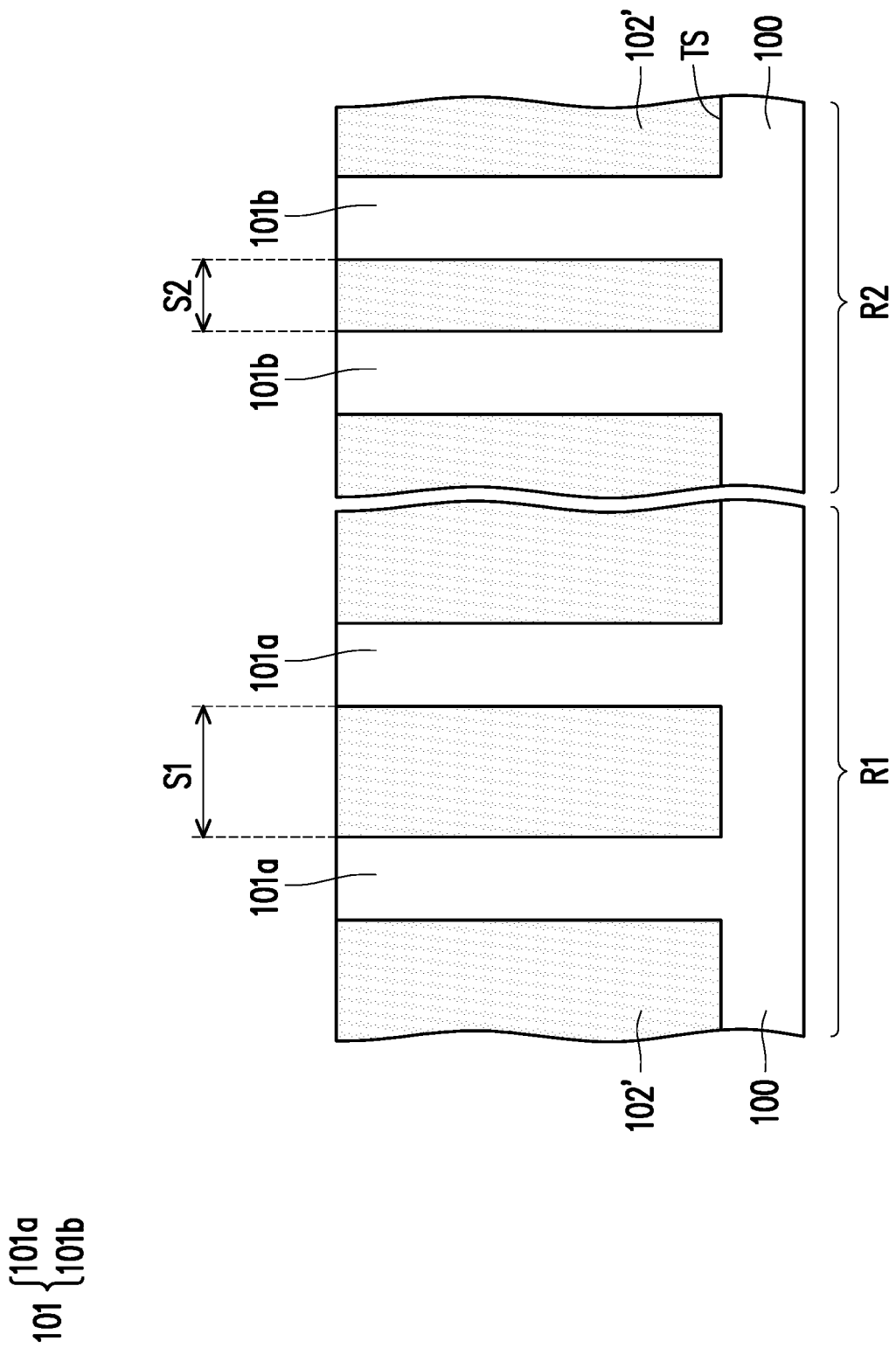

Referring to FIG. 4, a planarization process is performed to remove excess portions of the insulation material 102' over the top surfaces of the fins 101. In some embodiments, the planarization process includes a chemical mechanical polish (CMP), an etch back process, combinations thereof, or the like. As such, the top surfaces of the fins 101 are exposed and may be substantially coplanar with the top surface of the insulation material 102'.

Figure 5:
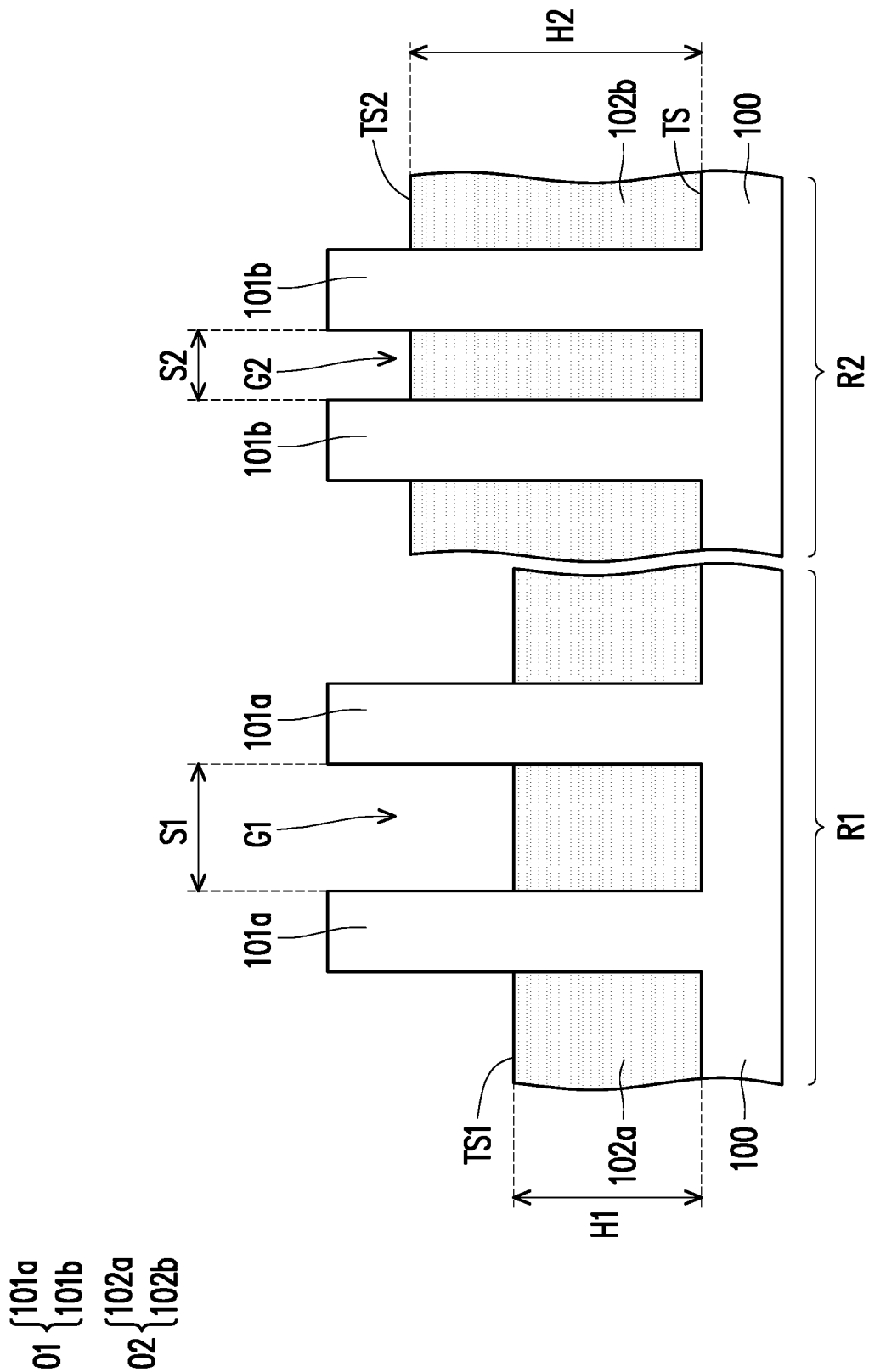

Referring to FIG. 4 and FIG. 5, the insulation material 102' is further recessed to form an isolation structure 102, such that upper portions of the fins 101 are exposed and protrude from the top surfaces of the isolation structure 102. In some embodiments, the isolation structure 102 is Shallow Trench Isolation (STI) structure. An acceptable etching process (such as, dry etching, wet etching or a combination thereof) may be performed to remove portions of the insulation material 102' laterally covering upper portions of the fins 101, such that the insulation material 102' is recessed.

In some embodiments, during the etching process, since the spacing S1 between neighboring fins 101a in the first region R1 is larger than the spacing S2 between neighboring fins 101b in the second region R2, the etchant or etching gas used for etching the insulation material 102' is much easier to enter into the gap G1 between neighboring fins 101a compared to entering into the gap G2 between neighboring fins 101b. Accordingly, the etching rate of the insulation material 102' in the first region R1 is larger than the etching rate of the insulation material 102' in the second region R2, and therefore, the removal amount of the insulation material 102' in the first region R1 is larger than the removal amount of the insulation material 102' in the second region R2. As such, the isolation structure 102 is formed to have an uneven top surface and have different heights in the regions R1 and R2.

Referring to FIG. 5, in some embodiments, the isolation structure 102 includes the isolation structure 102a in the first region R1 and the isolation structure 102b in the second region R2. The isolation structure 102a may have a top surface TS1 lower than a top surface TS2 of the isolation structure 102b. In other words, the height H1 of the isolation structure 102a is less than the height H2 of the isolation structure 102b, and the height of the portion of the fin 101a protruding above the top surface TS1 of the isolation structure 102a is greater than the height of the portion of the fin 101b protruding above the top surface TS2 of the isolation structure 102b. In some embodiments, the ratio of the height H2 to the height H1 is larger than 1 due to the difference between spacings S1 and S2, and may range from 1 to 1.6 (excluding 1), for example. In some embodiments, each of the top surface TS1 and the top surface TS2 has a flat surface as illustrated, a convex surface, a concave surface (such as dishing), or the like.

Referring to FIG. 6, a dielectric layer 105 is formed to cover the fins 101. The dielectric layer 105 may include silicon oxide, silicon nitride, a combination thereof, or the like. In some embodiments, the dielectric layer 105 is a conformal layer, that is, the dielectric layer 105 has a substantially equal thickness extending along the region on which the dielectric layer 105 is formed. In some embodiments, the dielectric layer 105 is formed by a suitable deposition process such as CVD, atomic layer deposition (ALD), or the like, and extends along the surfaces of the fins 101 and the isolation structure 102. In alternative embodiments, the dielectric layer 105 may be formed by thermal oxidation process and formed on the fins 101 without being formed on the isolation structure 102.

Referring to FIG. 7A and FIG. 7B, a dummy gate layer 106' is formed on the dielectric layer 105. In some embodiments, the combination of the dummy gate layer 106' and the dielectric layer 105 may be referred to as dummy gate material. The dummy gate layer 106' may be a conductive material and may be selected from a group including amorphous silicon, polycrystalline-silicon (polysilicon), polycrystalline silicon-germanium (poly-SiGe), or the like or combinations thereof. In one embodiment, amorphous silicon is deposited and recrystallized to create polysilicon. The dummy gate layer may be formed by a deposition process such as physical vapor deposition (PVD), chemical vapor deposition (CVD), or other suitable deposition process.

The dummy gate layer 106' overlies the fins 101 and the isolation structure 102. In some embodiments, since the isolation structure 102b in the second region R2 is higher than the isolation structure 102a in the first region R1, the dummy gate layer 106' in the second region R2 is formed to have a top surface higher than a top surface of the dummy gate layer 106' in the first region R1. In other words, the dummy gate layer 106' includes a first portion P1' in the first region R1 and a second portion P2' in the second region R2, and the top surface TP2' of the second portion P2' is higher than the top surface TP1' of the first portion P1'. In some embodiments, the top surfaces of the fins 101*a* and 101*b* are substantially coplanar with each other, and a thickness T2' of the second portion P2' directly over the fins 101*b* is larger than the thickness T1' of first portion P1' directly over the fins 101*a*. The thickness of the dummy gate layer 106' on the corresponding fin 101 is related to the gate height of the subsequently formed gate electrode.

Referring to FIG. 7A, in some embodiments, each of the top surfaces TP1' and TP2' of the first and second portions P1'/P2' of the dummy gate layer 106' are undulated or uneven due to the uneven surfaces of underlying layers, and the top surface TP1' may be more undulated than the top surface TP2'.

Referring to FIG. 8A and FIG. 8B, a planarization process is performed on the dummy gate layer 106', so as to form a dummy gate layer 106 having substantially flat/planar top surface. In some embodiments, after the planarization process is performed, the dummy gate layer 106 includes a first portion P1 in the first region R1 and a second portion P2 in the second region R2, and the top surface TP1 of the first portion P1 is substantially coplanar with the top surface TP2 of the second portion P2. In other words, the thickness T1 of the first portion P1 directly over the fins 101*a* is substantially equal to the thickness T2 of the second portion P2 directly over the fins 101*b*. In some embodiments, the thickness T1/T2 partially defines the gate heights of the subsequent formed gate stacks in the first and second regions R1/R2.

In some embodiments, the planarization process may include a CMP process and may remove a part of the second portion P2' and/or a part of the first portion P1' of the dummy gate layer 106'. In some embodiments, during the planarization process, there has no other additional layers (such as, CMP stop layer and/or sacrificial layer) formed on the dummy gate layer 106'. In other words, the planarization (CMP) process is directly performed on the dummy gate layer 106'.

In general, the CMP process uses chemical and physical forces to smooth or planarize the workpiece (i.e., the dummy gate layer 106' of the semiconductor structure shown in FIG. 7A/7B). In particular, the surface of workpiece need to be planarized (i.e., the upper surface of the dummy gate layer 106') is brought into physical contact with a rotating polishing pad of a CMP apparatus while a slurry of chemical and abrasive components are introduced onto the workpiece. The rotating polishing pad and the slurry remove material from the dummy gate layer 106' until the dummy gate layer 106 has a flat/planar surface. In some embodiments, the CMP process is performed using time mode, and a relatively hard polishing pad is selected to polish the top surface of the dummy gate layer 106', such that the dummy gate layer 106 having substantially flat top surface is formed. In some embodiments, the polishing pad used for the CMP process of the dummy gate layer 106' may be harder than the polishing pad used for the CMP process of the insulation material 102 (FIG. 3), but the disclosure is not limited thereto.

Referring to FIG. 8A and FIG. 8B to FIG. 9A and FIG. 9B, a patterning process is performed on the dummy gate layer 106 and the dielectric layer 105, so as to form a dummy gate dielectric layer 105*a* and a dummy gate 106*a* in the first region R1, and a dummy gate dielectric layer 105*b* and a dummy gate 106*b* in the second region R2. The patterning process may include one or more lithograph and etching processes. The dummy gate 106*a* and the underlying dummy gate dielectric layer 105*a* constitute a dummy gate structure DG1, while the dummy gate 106*b* and the dummy gate dielectric layer 105*c* constitute a dummy gate structure DG2. The dummy gate structure DG1 and the dummy gate structure DG2 may be continuous or non-continuous.

Figure 9B:
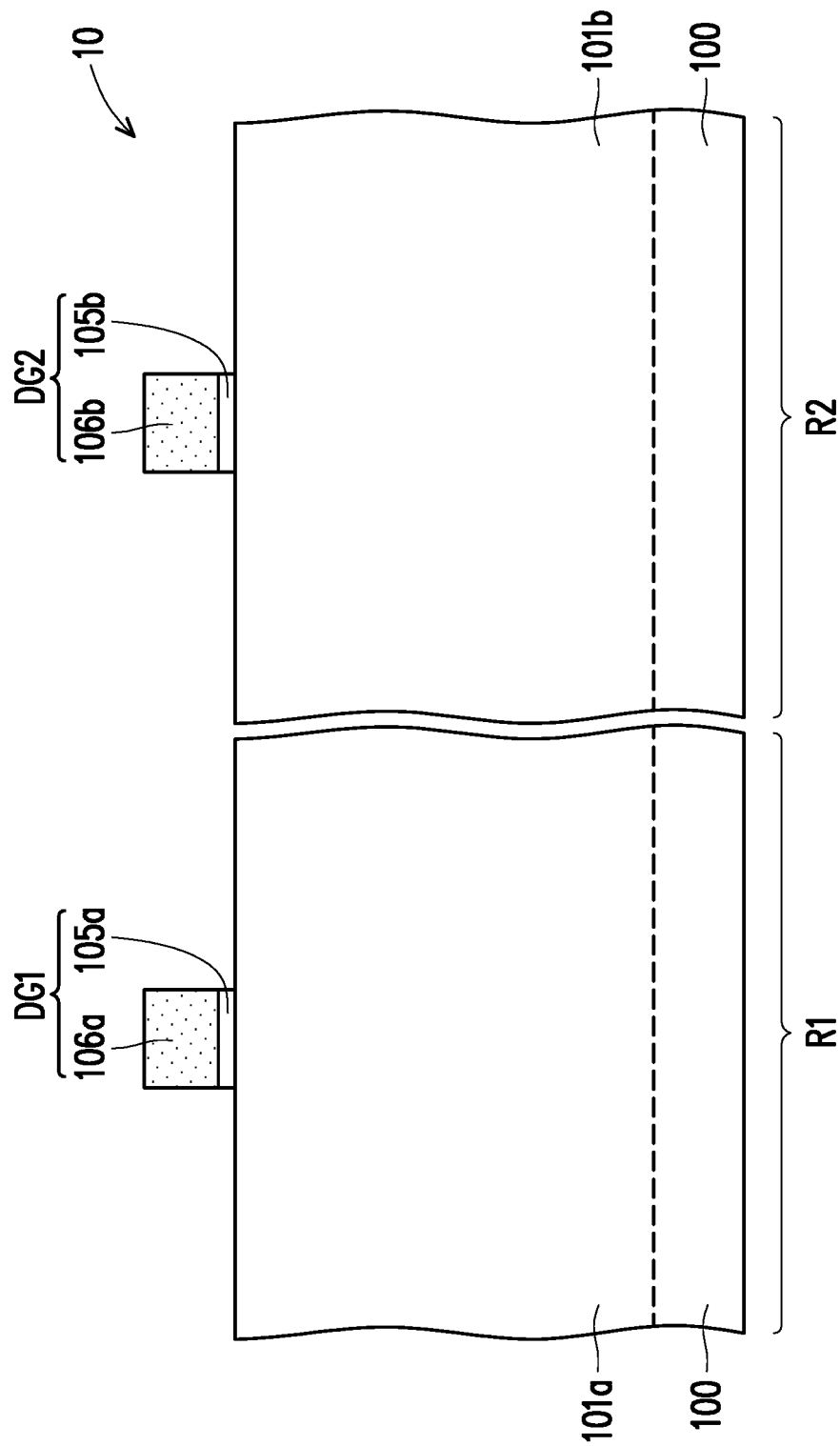

Referring to FIG. 1, FIG. 9A and FIG. 9B, the dummy gate structure DG1 extends along the direction D2 and across the fins 101*a*, while the dummy gate structure DG2 extends along the direction D2 and across the fins 101*b*. The top surface of the dummy gate structure DG1 (i.e. the top surface of the dummy gate 106*a*) is substantially coplanar with the top surface of the dummy gate structure DG2 (i.e. the top surface of the dummy gate 106*b*).

Figure 10A:
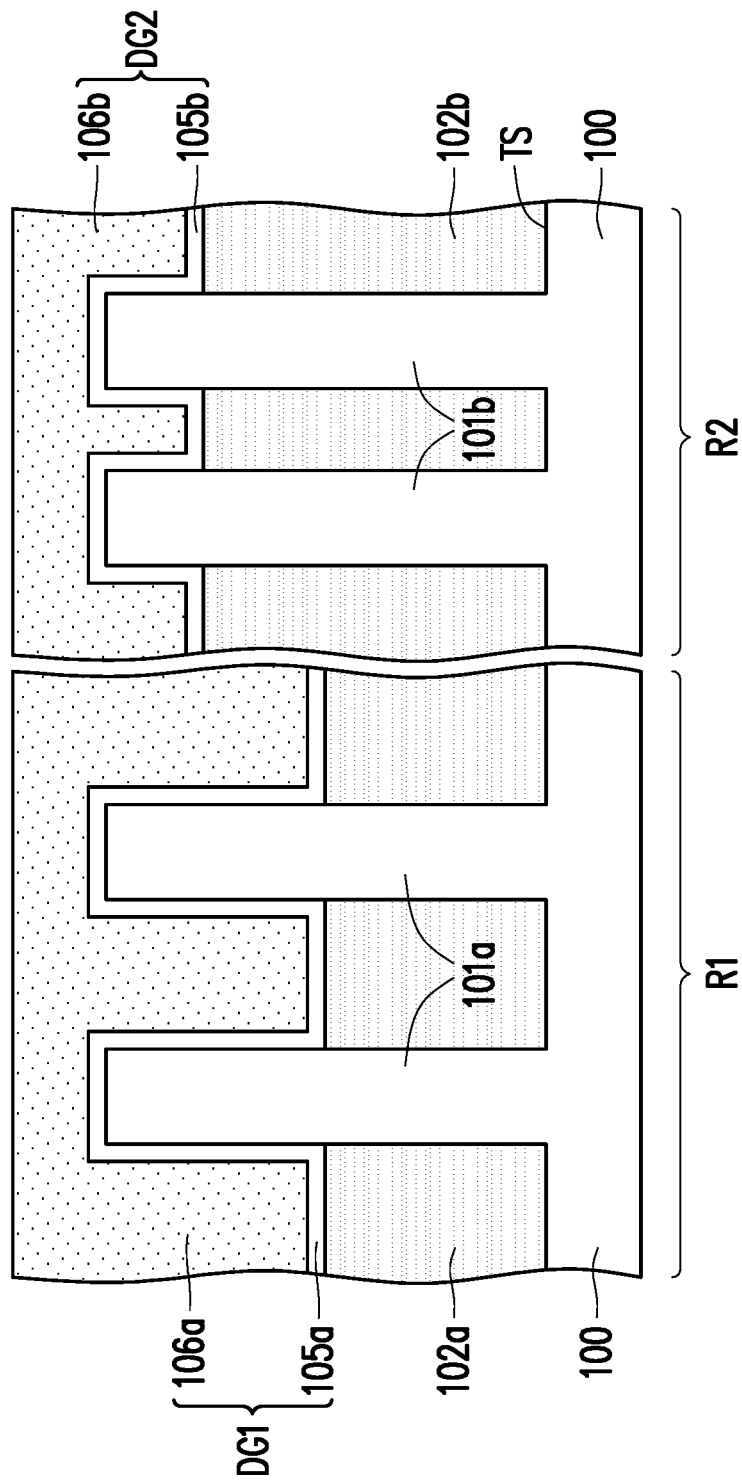
Figure 10B:
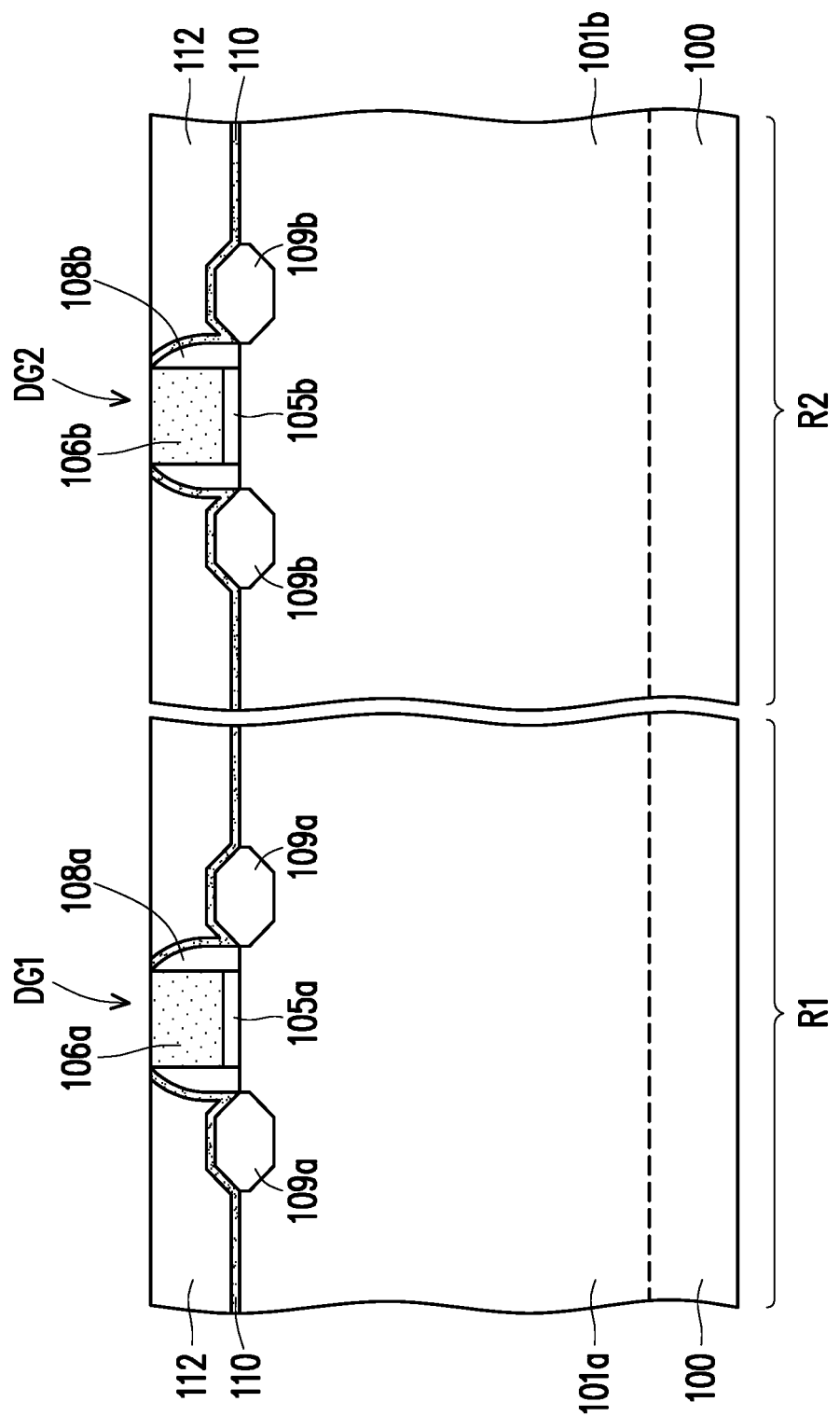

Referring to FIG. 10A and FIG. 10B, thereafter, spacers 108*a* and 108*b* are respectively formed on sidewalls of the dummy gate structures DG1 and DG2. In some embodiments, the spacer 108*a*/108*b* includes $SiO_2$, SiN, SiCN, SiOCN, SiC, SiOC, SiON, or the like, or combinations thereof. The spacers 108*a*/108*b* may be formed by suitable deposition process and etching process. For example, a spacer material is formed over the substrate to cover sidewalls and top surfaces of the dummy gate structures DG1 and DG2. Thereafter, an etching process, such as an etching back process is performed to remove excess portions (e.g., horizontal portions) of the spacer material, and remain the spacers 108*a* and 108*b* on sidewalls of the dummy gate structures DG1 and DG2. The spacers 108*a*, 108*b* are located on the fins 101 and the isolation structure 102 (not shown) and extend along the lengthwise direction D2 of the dummy gate structures DG1, DG2 to cover opposite sidewalls of the dummy gate structures DG1, DG2, respectively. The sidewall of the spacers 108*a*, 108*b* may be straight or slanted, or arced. It is noted that, the cross-sectional shape of the spacer 108*a*/108*b* is merely for illustration, and the disclosure is not limited thereto. The spacer 108*a*/108*b* may have any suitable shape.

After the spacers 108 are formed, source/drain (S/D) regions 109 are formed on opposite sides of the dummy gate structures DG1 and DG2 having spacers 108. The S/D regions 109 may be located in and/or on the fins 101 of the substrate 100. In some embodiments, the S/D regions 109 are strained layers (epitaxial layers) formed by epitaxial growing process such as selective epitaxial growing process. The formation of the S/D regions 109 may include the following processes: a recessing process is firstly performed on the fins 101, such that recesses are formed in the fins 101 on sides of the dummy gate structures DG1, DG2, and the strained layers are formed by selectively growing epitaxy layers from the fins 101 exposed in the recesses. In some embodiments, the strained layers include silicon germanium (SiGe), SiGeB, Ge, InSb, GaSb, InGaSb or combinations thereof for a P-type FinFET device. In alternative embodiments, the strained layers include silicon carbon (SiC), silicon phosphate (SiP), SiCP, InP, GaAs, AlAs, InAs, InAlAs, InGaAs or a SiC/SiP multi-layer structure, or combinations thereof for an N-type FinFET device. In some embodiments, the strained layers may be optionally implanted with an N-type dopant or a P-type dopant as needed. Alternatively or additionally, other suitable processes (e.g., implantation process) for forming S/D regions may also be used in the disclosure.

It is noted that, the shape and size of the S/D region 109 shown in the figures are merely for illustration, and the disclosure is not limited thereto. The S/D region 109 may have any suitable shape and size according to product design and requirement.

After the S/D regions 109 are formed, an etching stop layer 110 and a dielectric layer 112 are formed on the substrate 100 and laterally aside the dummy gate structures DG1, DG2 having spacers 108. The etching stop layer 110 may also be referred to as a contact etch stop layer (CESL), and is disposed between the substrate 100 (e.g. the S/D regions 109, the isolation structure 102, the fins 101 of the substrate 100) and the dielectric layer 112 and between the spacers 108 of the dummy gate structures DG1, DG2 and the dielectric layer 112. In some embodiments, the etching stop layer 110 includes SiN, SiC, SiOC, SiON, SiCN, SiOCN, or the like, or combinations thereof. The etching stop layer 110 may be formed by CVD, plasma-enhanced CVD (PECVD), ALD or the like.

The dielectric layer 112 is formed on the etching stop layer 110 and laterally aside the dummy gate structures DG1, DG2. The dielectric layer 112 includes a material different from that of the etching stop layer 110. In some embodiments, the dielectric layer 112 may also be referred to as an interlayer dielectric layer (ILD), such as ILD0. In some embodiments, the dielectric layer 112 includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 112 may include low-k dielectric material with a dielectric constant lower than 4, extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The dielectric layer 112 may be a single layer structure or a multi-layer structure. The dielectric layer 112 may be formed by CVD, PECVD, FCVD, spin coating or the like.

In some embodiments, the etching stop layer 110 and the dielectric layer 112 may be formed by the following processes: after the S/D regions 109 are formed, an etching stop material layer and a dielectric material layer are formed over the substrate 100 to cover sidewalls and top surfaces of the dummy gate structures DG1, DG2; thereafter, a planarization process is performed to remove excess portions of the etching stop material layer and the dielectric material layer over the top surfaces of the dummy gate structures DG1, DG2, so as to expose the dummy gate structures DG1, DG2, thereby forming the etching stop layer 110 and the dielectric layer 112 laterally aside the dummy gate structures DG1, DG2. In some embodiments, the top surfaces of the dielectric layer 112 and the etching stop layer 110 are substantially coplanar with the top surfaces of the dummy gate structures DG1 and DG2.

Thereafter, a gate replacement process is performed to replace the dummy gate structures DG1 and DG2 with metallic gate structures 118 (FIG. 12). The details are described as below.

Figure 11A:
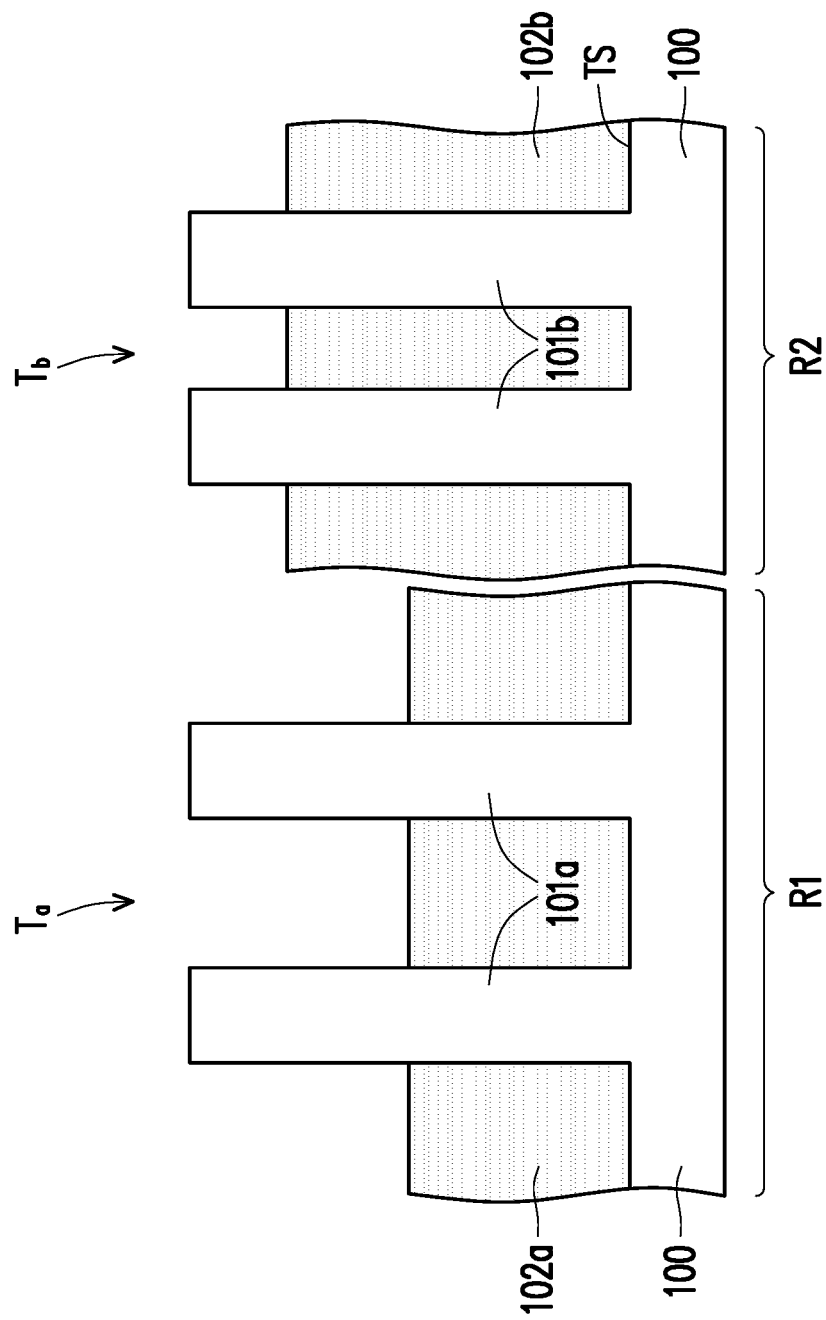
Figure 11B:
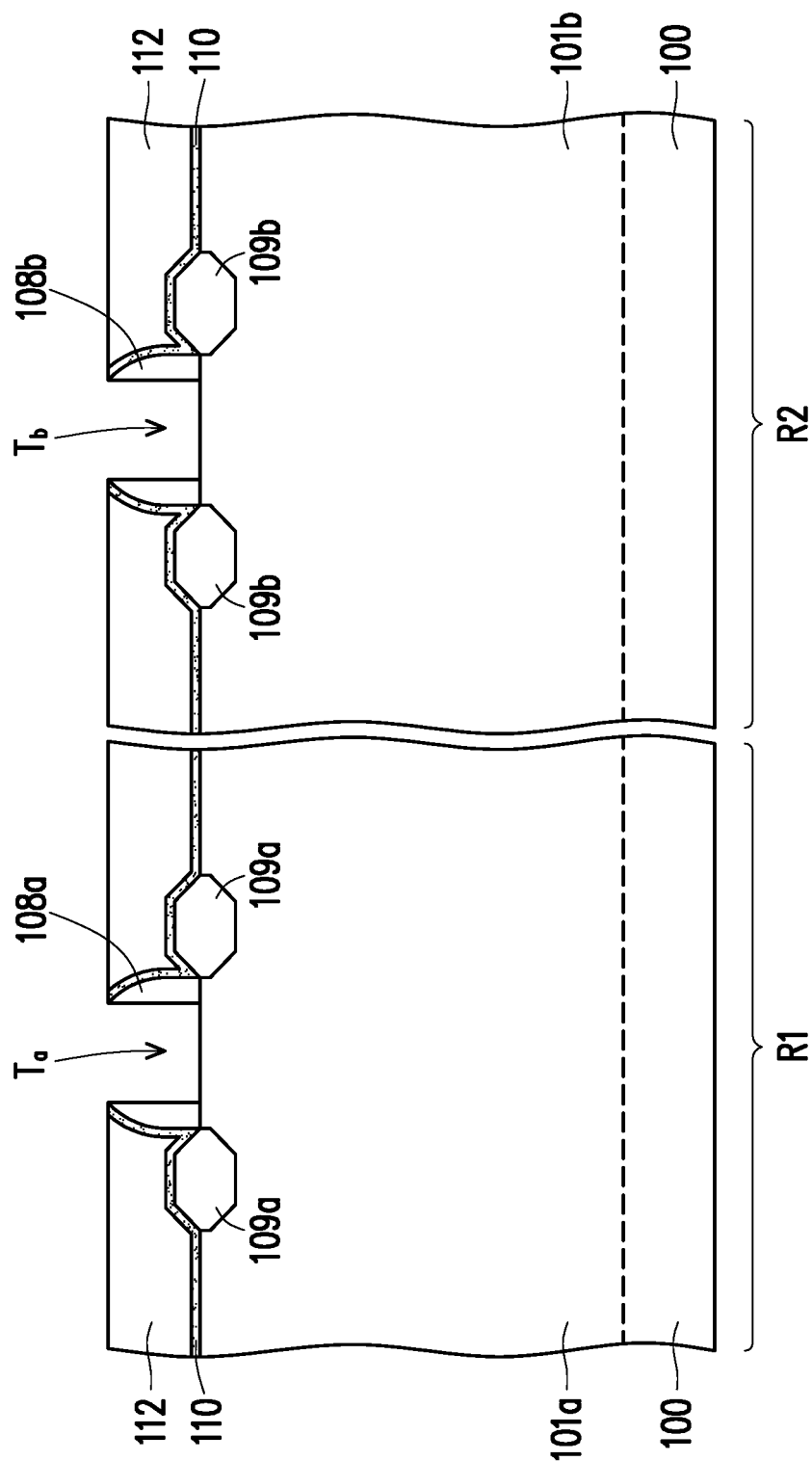

Referring to FIG. 11A and FIG. 11B, in some embodiments, the dummy gate structures DG1 and DG2 are removed by one or more etching processes, such as wet etching and/or dry etching. As such, a gate trench $T_a$ defined by spacers 108a is formed at the location previously occupied by the dummy gate structure DG1 in the first region R1, and a gate trench $T_b$ defined by spacers 108b is formed at the location previously occupied by the dummy gate structure DG2 in the second region R2. The gate trenches $T_a$ and $T_b$ expose upper portions of the fins 101a, 101b and the isolation structures 102a, 102b adjacent to the fins 101a, 101b, respectively.

Referring to FIG. 12A and FIG. 12B, thereafter, gate stacks 118a and 118b are formed in the gate trenches $T_a$ and $T_b$, respectively. In some embodiments, each of gate stacks 118 and 118b includes a gate dielectric layer and a gate electrode on the gate dielectric layer. In some embodiments, the gate electrode is metallic gate electrode, and may include a work function layer and a metal filling layer on the work function metal layer. For example, the gate stack 118a includes a gate dielectric layer 114a, a work function layer 115a and a metal filling layer 116a, and the gate stack 118b includes a gate dielectric layer 114b, a work function layer 115b and a metal filling layer 116b.

The work function layer is configured to tune a work function of its corresponding FinFET transistor to achieve a desired threshold voltage Vt. Each of the work function layers 115a, 115b maybe an N-type work function metal layer or a P-type work function metal layer, and the work function layers 115a and 115b may be the same types of work function layers or different types of work function layers depending on the types of the to-be-formed FinFET transistors. In some embodiments, the P-type work function layer may include a metal with a sufficiently large effective work function and may include one or more of the following: TiN, WN, TaN, conductive metal oxide, and/or a suitable material, or combinations thereof. The N-type work function layer may include a metal with sufficiently low effective work function and may comprise one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, suitable conductive metal oxide, or combinations thereof. Each of the work function layers 115a and 115b may be a single-layer structure or multi-layer structure. The metal filling layers 118a and 118b may include copper, aluminum, tungsten, cobalt (Co), or any other suitable metallic material, or the like or combinations thereof, respectively. In some embodiments, each of the gate electrodes may further include a seed layer, a barrier layer, other suitable layers or combinations thereof.

In some embodiments, the gate dielectric layers 114a and 114b are respectively disposed between the gate electrodes and the fins 101a and 101b, between the gate electrodes and the spacers 108 and 108b, and between the gate electrodes and the isolation structure 102. The gate dielectric layers 114a and 114b surround the sidewalls and bottom surface of the work functional layers 115a and 115b of the gate electrodes, respectively. However, the disclosure is not limited thereto. In alternative embodiments, the gate dielectric layer may be not disposed between the gate electrode and the corresponding spacer. In some embodiments, the gate dielectric layer 104 may include silicon oxide, silicon nitride, silicon oxynitride, high-k dielectric materials, or combinations thereof. The high-k dielectric material may have a dielectric constant such as greater than about 4, or greater than about 7 or 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, combinations thereof, or a suitable material. In alternative embodiments, the gate dielectric layer 104 may optionally include a silicate such as HfSiO, LaSiO, AlSiO, combinations thereof, or a suitable material. In some embodiments, the gate stack 118a/118b may further include an interfacial layer between the gate dielectric layer 114a/114b and the corresponding fin 101. The interfacial layer may include an oxide such as silicon oxide, and may be formed by a thermal oxidation process.

In some embodiments, the gate stacks 118a and 118b are formed by the following processes. A gate dielectric material, a work function material, and a metal filling material are sequentially formed over the substrate 100 to cover the dielectric layer 112 and fill in the gate trenches $T_a$ and $T_b$, by suitable deposition processes such as CVD, PECVD, PVD, ALD, or the like or combinations thereof. Thereafter, a planarization process is performed to remove excess portions of the metal filling material, the work function material and the gate dielectric material over the top surface of the dielectric layer 112. In some embodiments, the top surfaces of the gate dielectric layers 114a, the work function layer 115a, 115b, and the metal filling layers 116a remained in the trenches $T_a$ and $T_b$ are substantially coplanar with each other and substantially coplanar with the top surface of the dielectric layer 112.

Referring to FIG. 12B, the gate stack 118a, the spacers 108a and the S/D regions 109a constitute a FinFET transistor FT1 in the first region R1. The gate stack 118b, the spacers 108b and the S/D regions 109b constitute a FinFET transistor FT2 in the first region R2. The FinFET transistor FT1 and the FinFET transistor FT2 may have the same conductivity types (N-type, or P-type) or different conductivity types.

Figure 13B:
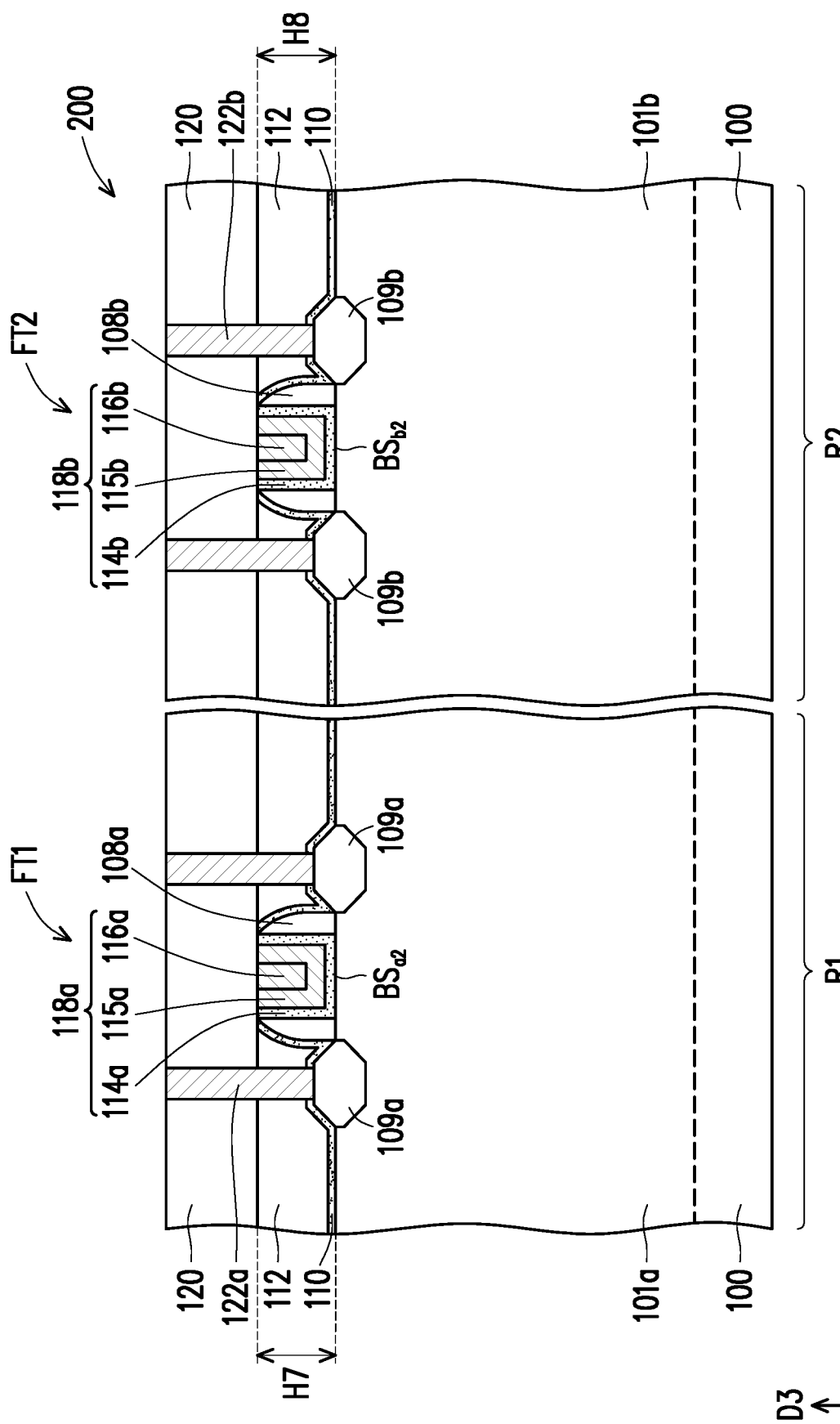

Referring to FIG. 13A and FIG. 13B, in some embodiments, a dielectric layer 120 is then formed on the dielectric layer 112 to cover the dielectric layer 112 and the transistors FT1 and FT2. The material of the dielectric layer 120 may be selected from the same candidate materials of the dielectric layer 112. In some embodiments, the dielectric layer 120 may also be referred to as ILD1. In some embodiments, an etching stop layer (not shown) may further be disposed between the dielectric layer 112 and the dielectric layer 120.

In some embodiments, contacts 122a and 122b are formed to penetrate through the dielectric layers 120 and 112 to connect to the S/D regions 109a and 109b, respectively. In some embodiments, each of the contacts 122a and 122b includes a barrier layer (not shown) and a conductive layer (not shown) on the barrier layer. The barrier layer may surround sidewalls and/or bottom surface of the conductive layer. The barrier layer may include titanium, tantalum, titanium nitride, tantalum nitride, manganese nitride or combinations thereof. The conductive layer may include metal, such as tungsten (W), copper (Cu), Ru, Ir, Ni, Os, Rh, Al, Mo, Co, alloys thereof, combinations thereof or any metallic material with suitable resistance and gap-fill capability.

In some embodiments, the contacts 122a and 122b may be formed by the following processes: a patterning process is performed to remove portions of the dielectric layers 120, 112 and the etching stop layer 110, so as to define contact holes exposing portions of the S/D regions 109a and 109b; a barrier material layer and a conductive material layer are formed on the dielectric layer 120 to fill the contact holes; thereafter, a planarization process is performed to remove excess portions of the barrier material layer and the conductive material layer over the top surface of the dielectric layer 138, and the remained barrier layer and conductive layer in the contact holes constitute the contacts 122a and 122b. In some embodiments, the top surfaces of the contacts 122a and 122b are substantially coplanar with the top surface of the dielectric layer 120.

In some embodiments, the S/D regions 109a and 109b may include silicide layers thereon, and the contacts 122a and 122b may land on the silicide layers of the S/D regions 109a, 109b, respectively. In some embodiments, the silicide layers may be formed before forming the etching stop layer 110. In alternative embodiments, the silicide layers may be formed after the contact holes are defined and before forming the contacts 122a and 122b. In some embodiments, the silicide layers may respectively include nickel silicide (NiSi), cobalt silicide (CoSi), titanium silicide (TiSi), tungsten silicide (WSi), molybdenum silicide (MoSi), platinum silicide (PtSi), palladium silicide (PdSi), CoSi, NiCoSi, NiPtSi, Ir, PtIrSi, ErSi, YbSi, PdSi, RhSi, or NbSi, or combinations thereof, and may be formed by a self-aligned silicide (salicide) process.

Referring to FIG. 13A and FIG. 13B, a semiconductor device (which is a FinFET device) 200 is thus formed. The FinFET device 200 includes a first region R1 and a second region R2. A plurality of fins 101a of the substrate 100, an isolation structure 102a, and transistor FT1 are disposed within the first region R1. A plurality of fins 101b of the substrate 100, an isolation structure 102b and transistor FT2 are disposed within the second region R2.

In some embodiments, the fins 101a and 101b are parallel with each other and extend along the same direction D1. Each of the fins 101a and 101b has a length extending along the direction D1 and a width in the direction D2 perpendicular to the direction D1. In some embodiments, the spacing S1 between two adjacent fins 101a is larger than the spacing S2 between two adjacent fins 101b. The top surfaces of the fins 101a may be substantially coplanar with the top surfaces of the fins 101b. In some embodiments, the fins 101a and 101b have the same heights. Herein, a height of a fin refers to the height of the fin protruding above the top surface TS of the substrate 100 (i.e. the vertical distance between the top surface of the fin and the top surface TS of the substrate) in the direction D3.

The isolation structures 102a and 102b are disposed on the substrate 100 and laterally covering portions of the fins 101a and 101b, respectively. The gate stack 118a is disposed on and across the fins 101a and the isolation structure 102a within the first region R1, and the gate stack 118b is disposed on and across the fins 101b and the isolation structure 102b within the second region R2. In some embodiments, the gate stacks 118a and 118b respectively extend along the direction D2 (i.e. the widthwise direction of the fins 101a and 101b). The gate stacks 118a and 118b may be continuous or non-continuous in the direction D2.

In some embodiments, the top surface of the isolation structure 102a is lower than the top surface of the isolation structure 102b, and the height H1 of the isolation structure 102a is less than the height H2 of the isolation structure 102b. The isolation structures 102a and 102b respectively include a portion $EP_1$ and a portion $EP_2$ laterally sandwiched between two adjacent fins 101a, 101b. In some embodiments, the width of the portion $EP_1$ of the isolation structure 102a is substantially equal to the spacing S1 of the fins 101a, and the width of the portion $EP_2$ of the isolation structure 102b is substantially equal to the spacing S2 of the fins 101b. In other words, the width of the portion $EP_1$ is larger than the width of the portion $EP_2$. That is to say, the portion $EP_2$ of the isolation structure 102b is narrower and higher (or thicker) than the portion $EP_1$ of the isolation structure 102a.

Still referring to FIG. 13A and FIG. 13B, each of the fins 101a includes a bottom portion $BP_1$ and an upper portion $UP_1$ on the bottom portion $BP_1$. The sidewalls of the bottom portion $BP_1$ are covered by and in contact with the isolation structure 102a, and the sidewalls and top surface of the upper portion $UP_1$ are covered (surrounded) by and in contact with the gate stack 118a. In other words, the upper portion $UP_1$ is embedded in the gate stack 118a. Similarly, each of the fins 101b includes a bottom portion $BP_2$ laterally covered by the isolation structure 102b, and an upper portion $UP_2$ having top surface and sidewalls wrapped by the gate stack 118b.

In some embodiments, the height of the lower portion $BP_1$ of the fin 101a (which is substantially equal to the height H1 of the isolation structure 102a) is less than the height of the lower portion $BP_2$ of the fin 101b (which is substantially equal to the height H2 of the isolation structure 102b). The height H3 of the upper portion $UP_1$ of the fin 101a is larger than the height H4 of the upper portion $UP_2$ of the fin 101b. In some embodiments, the width of the fin 101a may be substantially equal to or different from the width of the fin 101b. In some embodiments, the volume of the upper portion $UP_1$ of the fin 101a is larger than the volume of the upper portion $UP_2$ of the fin 101b. The contact area between the fin 101a and the gate stack 118a may be larger than the contact area between the fin 101b and the gate stack 118b. However, the disclosure is not limited thereto.

From another point of view, the channel region (i.e. the upper portion $UP_1$ wrapped by the gate stack 118a) of fin 101a has a height larger than a height of the channel region (i.e. the upper portion $UP_2$ wrapped by the gate stack 118b) of the fin 101b. The top surface of the channel region of the fin 101a is substantially coplanar with the top surface of the channel region of the fin 101b, and a bottom point of the channel region of the fin 101a is lower than a bottom point of the channel region of the fin 101b. In some embodiments, the channel region of the fin 101a has a larger volume than the channel region of the fin 101b. The contact area between the channel region of the fin 101a and the gate stack 118a may be larger than the contact area between the channel region of the fin 101b and the gate stack 118b.

In some embodiments, the gate stack 118a has a first bottom surface $BS_{a1}$ (i.e. bottommost surface) in contact with the top surface TS1 of the isolation structure 102a, a second bottom surface $BS_{a2}$ in contact with the top surface of the fin 101a, and a top surface $TS_{a1}$ over the top surface of the fin 101a. The gate stack 118b has a first bottom surface $BS_{b1}$ (i.e. bottommost surface) in contact with the top surface TS2 of the isolation structure 102b, a second bottom surface $BS_{b2}$ in contact with the top surface of the fin 101b, and a top surface $TS_{b1}$ over the top surface of the fin 101b. In some embodiments, the first bottom surface $BS_{a1}$ of the fin 101a may be lower than the first bottom surface $BS_{b1}$ of the fin 101b. The second bottom surface $BS_{a2}$ of the fin 101a may be substantially coplanar with the second bottom surface $BS_{b2}$ of the fin 101b. The top surface $TS_{a1}$ of the gate stack 118a may be substantially coplanar with the top surface $TS_{b1}$ of the gate stack 118b.

In other words, the gate stack 118a has a height H5 and a height H7. The height H5 of the gate stack 118a is defined by a vertical distance between the top surface $TS_{a1}$ and the bottom surface $BS_{a1}$ of the gate stack 118a in the direction D3, or between the top surface $TS_{a1}$ of the gate stack 118a and the top surface TS1 of the isolation structure 102a. The height H7 of the gate stack 118a is defined by a vertical distance between the top surface $TS_{a1}$ and the bottom surface $BS_{a2}$ of the gate stack 118a in the direction D3, or between the top surface $TS_{a1}$ of the gate stack 118a and the top surface of the fin 101a. Similarly, the gate stack 118b has a height H6 and a height H8. The height H6 of the gate stack 118a is defined by a vertical distance between the top surface $TS_{b1}$ and the bottom surface $BS_{b1}$ of the gate stack 118b in the direction D3, or between the top surface $TS_{b1}$ of the gate stack 118b and the top surface TS2 of the isolation structure 102b. The height H8 of the gate stack 118b is defined by a vertical distance between the top surface $TS_{b1}$ and the bottom surface $BS_{b2}$ of the gate stack 118b in the direction D3, or between the top surface $TS_{b1}$ of the gate stack 118b and the top surface of the fin 101b. The heights H7 and H8 may be also referred to as the gate heights of the gate stacks 118 and 118b, respectively. Herein, the term "gate height" refers to the height of the portion of the gate directly on the top surface of fin.

Still referring to FIG. 13A and FIG. 13B, in some embodiments, the height H5 of the gate stack 118a is larger than the height H6 of the gate stack 118b, while the height H7 of the gate stack 118a is substantially equal to the height H8 of the gate stack 118b. For example, the height H7/H8 may range from 10 nm to 30 nm. The height H5 may range from 110 nm to 130 nm. The height H6 may range from 60 nm to 90 nm. The ratio of the height H5 to the height H6 may range from 1.4 to 1.9. The height ratio in such range is primarily caused by the difference between spacings S1 and S2. If the ratio range is less than the lower limit, the height difference may be caused by processing error instead of the different spacings of fins. If the ratio range is larger than the upper limit, the difficulty of the previous CMP process for planarizing the dummy gate structure (FIG. 7 to FIG. 8) may be increased. In some embodiments, the gate stack 118a includes a portion $GP_1$ located on the portion $EP_1$ of the isolation structure 102a and laterally between two adjacent fins 101a, and the gate stack 118b includes a portion $GP_2$ located on the portion $EP_2$ of the isolation structure 102b and laterally between two adjacent fins 101b. In some embodiments, the portion $GP_1$ of the gate stack 118a is wider and thicker than the portion $GP_2$ of the gate stack 118b.

Referring to FIG. 13B, in some embodiments, parasitic capacitances may be formed between gate stacks 118a, 118b and the contacts 122a, 122b, respectively. In some embodiments, since the gate height H8 of the gate stack 118b is substantially equal to the gate height H7 of the gate stack 118a, the parasitic capacitance that may be formed between the gate stack 118b and the contact 122b may be substantially equal to the parasitic capacitance that may be formed between the gate stack 118a and the contact 122a, but the disclosure is not limited thereto. In other words, no excess parasitic capacitance happens on the gate stack 118b over the higher isolation structure 102b compared to the gate stack 118a over the lower isolation structure 102a.

In the embodiments of the disclosure, the fins having different spacings are formed, thereby causing the isolation structures in different regions have different height. During the CMP process for planarizing the dummy gate material, the formations of CMP stop layer and/or sacrificial layer on the dummy gate material are omitted. The dummy gate layer is directly planarized by the CMP process using time mode, and the CMP process uses a relatively hard polishing pad, so as to form a dummy gate layer with substantially flat top surface. As such, the cost of manufacturing is reduced, and the global and/or local gate height control is improved. In some embodiments, the gate heights on the different fins are controlled to be substantially the same as each other. No excess gate height happened on fins having different pattern (e.g., spacing), thereby avoiding excess parasitic capacitance generated between excess gate and the contact. Accordingly, the device performance is improved.

In accordance with some embodiments of the disclosure, a FinFET includes a substrate, a first gate stack and a second gate stack. The substrate has a first fin and a second fin. The first gate stack is across the first fin and extends along a widthwise direction of the first fin. The second gate stack is across the second fin and extends along a widthwise direction of the second fin. A bottommost surface of the first gate stack is lower than a bottommost surface of the second gate stack, and a first gate height of the first gate stack directly on the first fin is substantially equal to a second gate height of the second gate stack directly on the second fin.

In accordance with alternative embodiments of the disclosure, a FinFET device includes a substrate having first fins and second fins, a first isolation structure, a second isolation structure, a first gate stack and a second gate stack. A spacing between neighboring fins of the first fins is larger than a spacing between neighboring fins of the second fins. The first isolation structure is disposed on the substrate and between the neighboring fins of the first fins. The second isolation structure is disposed on the substrate and between the neighboring fins of the second fins. The first gate stack is disposed over the substrate and across the first fins and the first isolation structure. The second gate stack is disposed over the substrate and across the second fins and the second isolation structure. A top surface of the first gate stack is substantially coplanar with a top surface of the second gate stack.

In accordance with some embodiments of the disclosure, a method of forming a FinFET device includes: providing a substrate; patterning the substrate to form first fins within a first region and second fins within a second region, wherein the first fins are formed to have a first spacing between neighboring fins, the second fins are formed to have a second spacing between neighboring fins, and the first spacing is larger than the second spacing; forming a first isolation structure covering lower portions of the first fins, and a second isolation structure covering lower portions of the second fins; forming a dummy gate material to cover the first fins, the first isolation structure, the second fins and the second isolation structure; and performing a planarization process on the dummy gate material using time mode, such that the dummy gate material remained within the first region has a top surface substantially coplanar with a top surface of the dummy gate material remained within the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a FinFET device, comprising:
    providing a substrate;
    patterning the substrate to form first fins within a first region and second fins within a second region, wherein the first fins are formed to have a first spacing between neighboring fins, the second fins are formed to have a second spacing between neighboring fins, and the first spacing is larger than the second spacing;
    forming a first isolation structure covering lower portions of the first fins, and a second isolation structure covering lower portions of the second fins;
    forming a dummy gate material to cover the first fins, the first isolation structure, the second fins and the second isolation structure;
    performing a planarization process on the dummy gate material using time mode, such that the dummy gate material remained within the first region has a top surface substantially coplanar with a top surface of the dummy gate material remained within the second region, wherein the planarization process is performed without using an additional layer formed on the dummy gate material; and
    patterning the dummy gate material into a first dummy gate structure within the first region and a second dummy gate structure within the second region, wherein opposing sidewalls extending through an entire height of the first and the second dummy gate structure are substantially parallel to each other, and
    forming a first source/drain region on opposing sides of the first dummy gate structure within the first region and a second source/drain region on opposing sides of the second dummy gate structure within the second region, wherein a top surface of the first source/drain region formed over the first fin in the first region is substantially coplanar with a top surface of the second source/drain region formed over the second fin in the second region.

2. The method of claim 1, wherein forming the first isolation structure and the second isolation structure comprises:
    forming an insulation material to cover the first fins and the second fins; and
    performing an etching process to recess the insulation material, so as to expose upper portions of the first fins and upper portions of the second fins,
    wherein a removal amount of the insulation material within the first region is larger than a removal amount of the insulation material within the second region due to the larger spacing between the first fins.

3. The method of claim 1, wherein the first isolation structure is formed to have a top surface lower than a top surface of the second isolation structure, and a first top surface of the dummy gate material within the first region is lower than a second top surface of the dummy gate material within the second region before performing the planarization process.

4. The method of claim 1, wherein after performing the planarization process, further comprising:
    replacing the first dummy gate structure and the second dummy gate structure with a first gate stack and a second gate stack, respectively,
    wherein a top surface of the first gate stack is formed to be substantially coplanar with a top surface of the second gate stack.

5. The method of claim 4, wherein a gate height of the first gate stack directly over the first fin is substantially equal to a gate height of the second gate stack directly over the second fin.

6. The method of claim 4, wherein a height of the first gate stack directly over the first isolation structure is higher than a height of the second gate stack directly over the second isolation structure.

7. A method of forming a FinFET device, comprising:
    patterning a substrate to form first fins within a first region and second fins within a second region, wherein the first fins are spaced apart by a first spacing, the second fins are spaced apart by a second spacing, and the first spacing is larger than the second spacing;

forming a first isolation structure laterally encapsulating lower portions of the first fins, and a second isolation structure laterally encapsulating lower portions of the second fins;

forming a gate material to cover the first fins, the first isolation structure, the second fins and the second isolation structure; and partially removing the gate material such that the gate material remained within the first region has a top surface substantially coplanar with a top surface of the gate material remained within the second region, wherein the gate material is uncovered by an additional layer when the gate material is partially removed; and patterning the gate material into a first dummy gate structure within the first region and a second dummy gate structure within the second region, wherein opposing sidewalls extending through an entire height of the first and the second dummy gate structure are substantially parallel to each other, and forming a first source/drain region on opposing sides of the first dummy gate structure within the first region and a second source/drain region on opposing sides of the second dummy gate structure within the second region, wherein a top surface of the first source/drain region formed over the first fin in the first region is substantially coplanar with a top surface of the second source/drain region formed over the second fin in the second region.

8. The method of claim 7, wherein forming the first isolation structure and the second isolation structure comprises:
   forming an insulation material to cover the first fins and the second fins; and
   performing an etching process to recess the insulation material to expose upper portions of the first fins and upper portions of the second fins,
   wherein a removal amount of the insulation material within the first region is larger than a removal amount of the insulation material within the second region due to the larger spacing between the first fins.

9. The method of claim 7, wherein the first isolation structure is formed to have a top surface lower than a top surface of the second isolation structure, and a first top surface of the gate material within the first region is lower than a second top surface of the gate material within the second region before partially removing the gate material.

10. The method of claim 7, wherein after partially removing the gate material, further comprising:
    replacing the first dummy gate structure and the second dummy gate structure with a first gate stack and a second gate stack, respectively,
    wherein a top surface of the first gate stack is formed to be substantially coplanar with a top surface of the second gate stack.

11. The method of claim 10, wherein a gate height of the first gate stack directly over the first fin is substantially equal to a gate height of the second gate stack directly over the second fin.

12. The method of claim 10, wherein a height of the first gate stack directly over the first isolation structure is higher than a height of the second gate stack directly over the second isolation structure.

13. The method of claim 7, wherein a ratio of the second spacing to the first spacing ranges from about 0.009 to about 0.5.

14. A method of forming a FinFET device, comprising:
    patterning a substrate to form first fins within a first region and second fins within a second region, wherein the first fins are spaced apart by a first spacing, the second fins are spaced apart by a second spacing, and the first spacing is larger than the second spacing;
    forming a first isolation structure laterally encapsulating lower portions of the first fins, and a second isolation structure laterally encapsulating lower portions of the second fins;
    forming a gate material to cover the first fins, the first isolation structure, the second fins and the second isolation structure; and
    polishing the gate material without using a sacrificial layer formed over the gate material, such that a first bottommost surface of the gate material remained within the first region is lower than a second bottommost surface of the gate material remained within the second region, and a first top surface of the gate material remained within the first region substantially levels a second top surface of the gate material remained within the second region; and
    patterning the gate material into a first dummy gate structure within the first region and a second dummy gate structure within the second region, wherein opposing sidewalls extending through an entire height of the first and the second dummy gate structure are substantially parallel to each other, and
    forming a first source/drain region on opposing sides of the first dummy gate structure within the first region and a second source/drain region on opposing sides of the second dummy gate structure within the second region, wherein a top surface of the first source/drain region formed over the first fin in the first region is substantially coplanar with a top surface of the second source/drain region formed over the second fin in the second region.

15. The method of claim 14, wherein forming the first isolation structure and the second isolation structure comprises:
    forming an insulation material to cover the first fins and the second fins; and
    performing an etching process to recess the insulation materials to expose upper portions of the first fins and upper portions of the second fins,
    wherein a removal amount of the insulation material within the first region is larger than a removal amount of the insulation material within the second region due to the larger spacing between the first fins.

16. The method of claim 14, wherein the first isolation structure is formed to have a top surface lower than a top surface of the second isolation structure, and a first top surface of the gate material within the first region is lower than a second top surface of the gate material within the second region before performing the polishing process.

17. The method of claim 14, wherein after performing the patterning process of the gate material, further comprising performing a gate replacement process.

18. The method of claim 17, wherein a gate height of the first gate stack directly over the first fin is substantially equal to a gate height of the second gate stack directly over the second fin.

19. The method of claim 17, wherein a height of the first gate stack directly over the first isolation structure is higher than a height of the second gate stack directly over the second isolation structure.

20. The method of claim 14, wherein a ratio of the second spacing to the first spacing ranges from about 0.009 to about 0.5.

* * * * *